United States Patent
Nanan et al.

(10) Patent No.: US 11,621,673 B2
(45) Date of Patent: Apr. 4, 2023

(54) POWER AMPLIFIER PACKAGES AND SYSTEMS INCORPORATING DESIGN-FLEXIBLE PACKAGE PLATFORMS

(71) Applicant: NXP USA, Inc., Austin, TX (US)

(72) Inventors: Jean-Christophe Nanan, Toulouse (FR); David James Dougherty, Tempe, AZ (US); Scott Duncan Marshall, Chandler, AZ (US); Lakshminarayan Viswanathan, Phoenix, AZ (US); Xavier Hue, Frouzins (FR)

(73) Assignee: NXP USA, Inc., Austin, TX (US)

( * ) Notice: Subject to any disclaimer, the term of this patent is extended or adjusted under 35 U.S.C. 154(b) by 286 days.

(21) Appl. No.: 16/830,787

(22) Filed: Mar. 26, 2020

(65) Prior Publication Data
US 2020/0328721 A1 Oct. 15, 2020

(30) Foreign Application Priority Data
Apr. 12, 2019 (EP) .................................... 19305473

(51) Int. Cl.
*H03F 3/14* (2006.01)
*H03F 1/02* (2006.01)
(Continued)

(52) U.S. Cl.
CPC ........... *H03F 1/0288* (2013.01); *H01L 23/66* (2013.01); *H01L 24/48* (2013.01); *H01L 24/49* (2013.01);
(Continued)

(58) Field of Classification Search
CPC .. H03F 1/0288; H03F 3/211; H03F 2200/222; H03F 2200/387; H03F 2200/451; H03F 2200/114; H03F 3/602; H03F 3/607; H03F 3/60; H03F 3/195; H03F 3/68; H01L 23/66; H01L 24/48; H01L 24/49; H01L 25/0655; H01L 2223/6611; H01L 2223/6627; H01L 2223/6655; H01L 2224/48175; H01L 2224/49175; H01L 2224/48195; H01L 2224/48247;
(Continued)

(56) References Cited

U.S. PATENT DOCUMENTS

| 6,798,295 B2 * | 9/2004 | Pengelly ............... H01L 25/072 330/307 |
| 8,022,760 B2 | 9/2011 | Gajadharsing et al. |

(Continued)

*Primary Examiner* — Khanh V Nguyen

(57) ABSTRACT

Embodiments of Doherty Power Amplifier (PA) and other PA packages are provided, as are systems including PA packages. In embodiments, the PA package includes a package body having a longitudinal axis, a first group of input-side leads projecting from a first side of the package body and having an intra-group lead spacing, and a first group of output-side leads projecting from a second side of the package body and also having the intra-group lead spacing. A first carrier input lead projects from the first package body side and is spaced from the first group of input-side leads by an input-side isolation gap, which has a width exceeding the intra-group lead spacing. Similarly, a first carrier output lead projects from the second package body side, is laterally aligned with the first carrier input lead, and is separated from the first group of output-side leads by an output-side isolation gap.

23 Claims, 15 Drawing Sheets

(51) Int. Cl.
*H01L 23/66* (2006.01)
*H01L 23/00* (2006.01)
*H01L 25/065* (2023.01)
*H03F 3/21* (2006.01)

(52) U.S. Cl.
CPC .......... *H01L 25/0655* (2013.01); *H03F 3/211* (2013.01); *H01L 2223/6611* (2013.01); *H01L 2223/6627* (2013.01); *H01L 2223/6655* (2013.01); *H01L 2224/48175* (2013.01); *H01L 2224/49175* (2013.01); *H03F 2200/222* (2013.01); *H03F 2200/387* (2013.01); *H03F 2200/451* (2013.01)

(58) Field of Classification Search
CPC ......... H01L 2224/49111; H01L 23/057; H01L 2223/6644; H01L 25/072; H01L 23/48; H01L 23/3107; H01L 23/49541
USPC ...................................... 330/124 R, 286, 295
See application file for complete search history.

(56) References Cited

U.S. PATENT DOCUMENTS

| | | | |
|---|---|---|---|
| 8,395,450 B2 * | 3/2013 | Deguchi | H03F 3/68 330/124 R |
| 9,077,285 B2 * | 7/2015 | Holmes | H01L 25/072 |
| 9,419,566 B2 | 8/2016 | Noori et al. | |
| 10,069,462 B1 * | 9/2018 | Min | H03F 1/0288 |
| 10,249,582 B2 * | 4/2019 | Yang | H03F 1/0288 |
| 2004/0145034 A1 * | 7/2004 | Fujioka | H01L 23/66 257/664 |
| 2014/0312976 A1 * | 10/2014 | Noori | H03F 3/68 330/295 |
| 2015/0340306 A1 | 11/2015 | Komposch et al. | |
| 2016/0344349 A1 * | 11/2016 | Shiikuma | H03F 3/195 |
| 2016/0352292 A1 | 12/2016 | Noori et al. | |
| 2018/0211907 A1 * | 7/2018 | Bajuri | H01L 23/49555 |
| 2020/0059204 A1 * | 2/2020 | Kahloon | H01L 25/16 |

* cited by examiner

US 11,621,673 B2

POWER AMPLIFIER PACKAGES AND SYSTEMS INCORPORATING DESIGN-FLEXIBLE PACKAGE PLATFORMS

CROSS-REFERENCE TO RELATED APPLICATION

This application claims priority under 35 USC 119 to European Patent Application number 19305473.1, filed on Apr. 12, 2019.

TECHNICAL FIELD

Embodiments of the present invention relate generally to microelectronics and, more particularly, to power amplifier packages incorporating design-flexible package platforms, as well as to power amplifier systems containing such packages.

ABBREVIATIONS

Abbreviations appearing relatively infrequently in this document are defined upon initial usage, while abbreviations appearing more frequently in this document are defined below:
FET—field effect transistor;
IC—integrated circuit;
IPD—integrated passive device;
MN—matching network;
PA—power amplifier;
PCB—printed circuit board; and
RF—radiofrequency.

BACKGROUND

Wireless communication systems, such as cellular base stations, often incorporate microelectronic packages containing Doherty PAs (herein, "Doherty PA packages") to boost the strength of RF signals. Traditionally, a Doherty PA package includes at least one carrier transistor and at least one peaking transistor arranged in a symmetrical, two-way, dual path configuration. The transistors are typically provided on separate semiconductor dies, which are attached to die bond regions of an electrically-conductive flange or substrate in a side-by-side relationship. A carrier (or main) signal amplification path extends from a carrier input lead, through the carrier transistor, and to a carrier output lead; while a parallel peaking (or auxiliary) signal amplification path extends from a peaking input lead, through the peaking transistor, and to a peaking output lead. The transistor dies, and the die bond regions to which the transistor dies are attached, are imparted with substantially equivalent dimensions in the case of a symmetric Doherty PA package. Similarly, the input and output leads of the transistor dies are typically imparted with equivalent widths generally corresponding to the widths of the die bond regions, taken along the longitudinal axis of the PA package.

While symmetric two-way Doherty architectures remain common, PA packages incorporating more complex Doherty architectures have gained increasing popularity. Three- and four-way Doherty PA packages with symmetric and asymmetric layouts, for example, now enjoy widespread commercial availability. With respect to Doherty PA packages having asymmetric layouts, in particular, a greater share of available die bond area is allotted to the peaking transistor die or dies contained within the package than to the carrier transistor die or dies. This allows an increase in the size the peaking transistor(s) within the Doherty PA package relative to the carrier transistor(s) for enhanced performance characteristics; e.g., increased gain, linearity, stability, and/or power-added efficiency levels. In certain cases, the respective widths of the input and outputs leads may also be varied in a corresponding asymmetric relationship. Accordingly, certain asymmetric Doherty PA packages are fabricated to include input and output leads of varying widths. Generally, the wider leads align with the wider die bond area(s) to which the peaking transistor die(s) are attached, while narrower leads align with the narrower die bond area(s) to which the carrier transistor die(s) are bonded. Such asymmetric Doherty PA packages are well-suited for fabrication utilizing leadframe-based manufacturing approaches and can provide certain benefits, such as increased uniformity in current distribution and a reduced likelihood of cross-coupling between electrical signals conducted through adjacent carrier and peaking signal amplification paths of the PA package. Despite this, still further improvements are sought in the performance characteristics and design flexibility of Doherty PA packages and PA packages, generally.

BRIEF DESCRIPTION OF THE DRAWINGS

At least one example of the present invention will hereinafter be described in conjunction with the following figures, wherein like numerals denote like elements, and.

Figure 1:
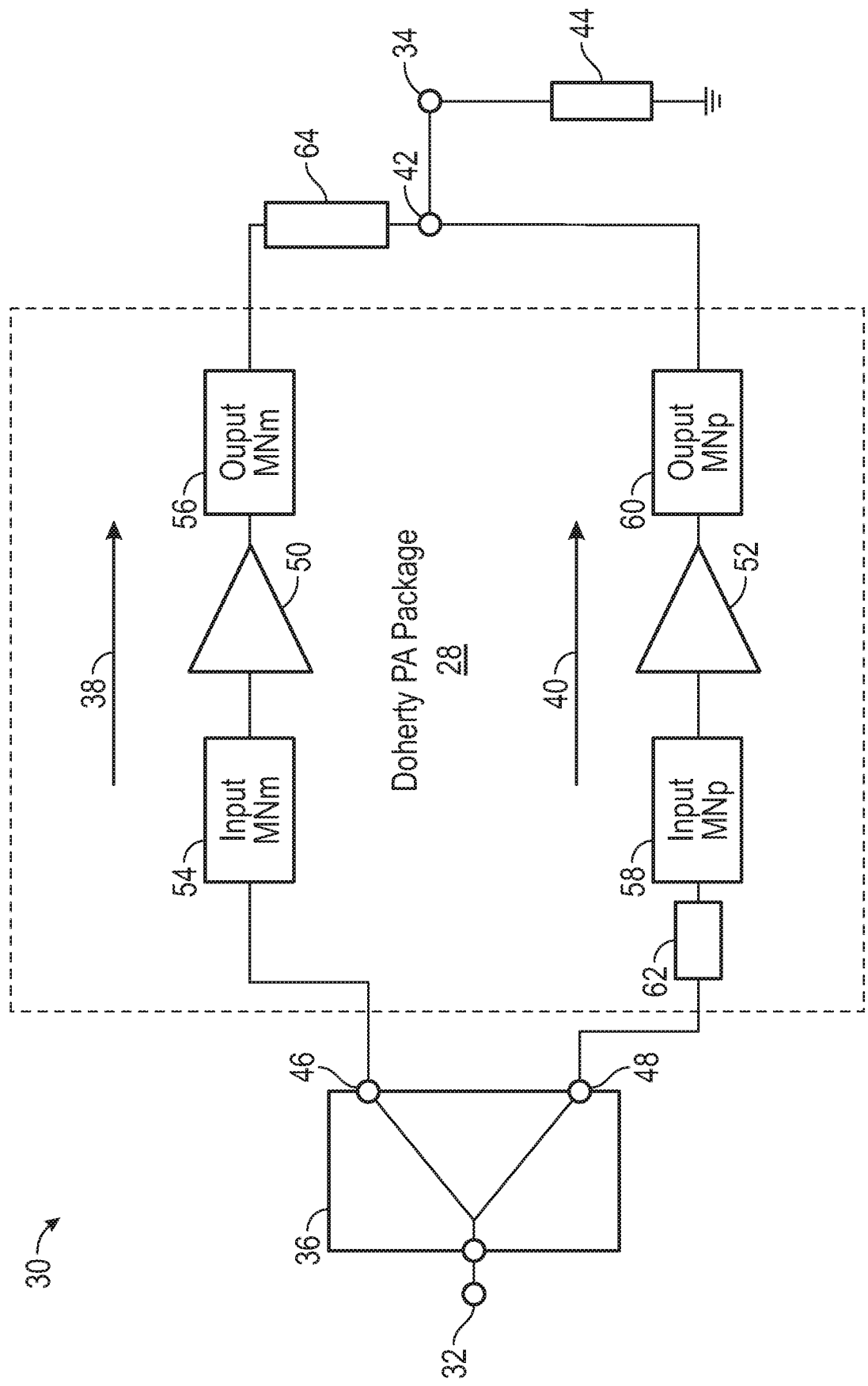
FIG. 1 is a simplified schematic diagram of a Doherty PA circuit structure, which may be partially or wholly implemented within a microelectronic package, as illustrated in accordance with an example embodiment.

For simplicity and clarity of illustration, descriptions and details of well-known features and techniques may be omitted to avoid unnecessarily obscuring the example and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

Embodiments of the present disclosure are shown in the accompanying figures of the drawings described briefly above. Various modifications to the example embodiments may be contemplated by one of skill in the art without departing from the scope of the present invention, as set-forth the appended claims.

Definitions

The following definitions apply throughout this document. Those terms not expressly defined here or elsewhere in this document are assigned their ordinary meaning in the relevant technical field.

Input-Side Lead—a lead located on a side of microelectronic package from which at least two input leads project.

Laterally-Aligned—aligned along an axis perpendicular to the longitudinal axis of a microelectronic package and parallel to the frontside of one or more semiconductor die contained in the package and/or parallel to a die bond region of the package flange or other substrate.

Output-Side Lead—a lead located on a side of microelectronic package from which at least two output leads project.

Power Amplifier (PA) Package—a microelectronic package of any type containing at least one power transistor utilized to amplify an electrical signal, such as an RF signal.

Power Amplifier (PA) Package Platform—A base package structure suitable for further processing, such as by die attachment, electrical interconnection, and package enclosure, to produce a completed PA package (defined above).

OVERVIEW

The following describes PA packages produced utilizing design-flexible PA platforms, as well as PA systems incorporating such PA packages. The PA packages usefully assume the form of Doherty PA packages and are principally described below as such; however, other types of PA packages can be fabricated utilizing the design-flexible PA platforms including, for example, single package push-pull-type PA devices. As indicated by the term "design-flexible," the PA platforms described herein are capable of supporting multiple different PA configurations. For example, a single design-flexible PA package platform can be processed differently to fabricate Doherty PA packages of varying layout configurations or circuit topologies, as determined during the die attachment, electrical interconnection, and package enclosure phases of the manufacturing process. A first manufacturing entity may thus produce the design-flexible PA package platform, with the same manufacturing entity or another entity then further processing the PA package to produce a Doherty (or other) PA package having a desired circuit layout and functionality. This enhances design flexibility allowing purchasers to readily tailor PA packages to best suit the needs of a particular application or usage, while minimizing manufacturing cost through scaled production of a common PA platform.

Embodiments of the Doherty PA package may include multi-lead arrays extending from opposing sides (herein, the input and output sides) of the package body. As described more fully below, the lead arrays may be grouped or clustered in embodiments such that certain lead groups are separated from adjacent lead groups by enlarged isolation gaps to, for example, decrease cross-coupling between adjacent peaking and carrier signal amplification paths. Whether or not arranged in closely-spaced lead groups separated by such isolation gaps, the input-side lead array and the output-side lead array may each contain at least three leads enabling fabrication of the PA package to include a desired number of peaking and/or carrier signal amplification paths, to provide an asymmetrical allotment of die bond area in favor the peaking transistor(s), to support N-way Doherty circuit layouts (N>2), and/or to provide enhanced isolation reducing cross-coupling between signal carrying (e.g., peaking and carrier) paths, as desired. Further, in contrast to asymmetric Doherty packages having leads of varying widths, embodiments of the PA package may be produced to include asymmetric Doherty layouts disposed between uniform-width lead arrays spaced along the input and output sides of the package. Still further benefits may be provided by the disclosed Doherty PA packages and package platforms, as will become apparent from the following description.

Turning to the drawing figures, a description of an example Doherty PA package produced utilizing a design-flexible PA package platform is described below in connection with FIGS. 3-7; an example PA system in which the Doherty PA package of FIGS. 3-7 may be installed is described below in connection with FIGS. 8-10; a number of other PA package configurations alternatively produced utilizing the same design-flexible PA package platform are discussed below in connection with FIGS. 11-13; and additional examples of Doherty PA packages having different form factors and lead counts are further discussed below in connection with FIGS. 14 and 15. First, however, a general description of Doherty PA circuits and packages is set-forth below in conjunction with FIGS. 1 and 2 to establish an exemplary, albeit non-limiting context in which embodiments of the present disclosure may be better understood.

General Discussion of Example Doherty PA Circuits and Packages Containing the Same FIG. 1 is a simplified schematic diagram of a Doherty PA circuit 30, as illustrated in accordance with an example embodiment of the present disclosure. As indicated by a dashed box 28, the illustrated Doherty PA circuit 30 may be partially integrated into a Doherty PA package. The Doherty PA circuit 30 includes an input node 32, an output node 34, and a power divider 36 (or splitter) between the nodes 32, 34. The Doherty PA circuit 30 further includes a main or "carrier" amplifier signal path (represented by arrow 38), an auxiliary or "peaking" signal amplification path (represented by arrow 40), and a combining node 42 at which the signal amplification paths 38, 40 converge. A load 44 may be coupled to the combining node 42, such as through a non-illustrated impedance transformer, to receive an amplified RF signal from the Doherty PA circuit 30. The Doherty PA circuit 30 may be beneficially incorporated in a larger, non-illustrated PA system, such as a cellular base station or other wireless communication system.

The power divider 36 is configured to divide the power of an input RF signal received at the input node 32 into carrier and peaking portions (herein, "a carrier input signal" and a "peaking input signal"). The carrier input signal is provided to the carrier amplification path 38 via the power divider output 46, while the peaking input signal is provided to the peaking amplification path 40 via the power divider output 48. When operating in a full-power mode in which the carrier and peaking amplifiers 50, 52 concurrently supply current to the load 44, the power divider 36 divides the input signal power between the signal amplification paths 38, 40. When the illustrated circuit 30 is imparted with a symmetric Doherty PA configuration, the power divider 36 may apportion power in a substantially equal manner, such that approximately one half of the input signal power is provided to each signal amplification path 38, 40. In other instances, such when the illustrated circuit 30 is imparted with an asymmetric Doherty PA configuration, the power divider 36 may apportion power unequally between the signal amplification paths 38, 40. Essentially, then, the power divider 36 divides an input RF signal supplied at the input node 32, with the divided signal portions then separately amplified along the carrier (main) and peaking (auxiliary) amplification paths 38, 40.

The carrier amplifier 50 and the peaking amplifier 52 each include at least one power transistor IC for amplifying RF signals conducted through the amplifiers 50, 52. Each power transistor IC may be fabricated on a semiconductor die and imparted with either a single-stage or multi-stage configuration. In embodiments, all amplifier stages (or a final amplifier stage) of either or both the carrier amplifier 50 and the peaking amplifier 52 may be implemented utilizing any of the following: a silicon-based FET (e.g., a laterally-diffused metal oxide semiconductor FET, or LDMOS FET) or a III-V FET (e.g., a gallium nitride (GaN) FET, a (gallium arsenide) GaAs FET, a (gallium phosphide) GaP FET, an indium phosphide (InP) FET, or an indium antimonide (InSb) FET), or another type of III-V transistor). The carrier and peaking transistor ICs may be equally sized when, for example, the circuit 30 has a symmetric Doherty configuration. Alternatively, the carrier and peaking transistor ICs may have unequal sizes in the case of various asymmetric Doherty configurations; it being understood that the term "size," as appearing in this context, is utilized in reference to planform dimensions or surface area occupied by the power transistor ICs. In an asymmetric Doherty configuration, specifically, the peaking transistor IC(s) may be larger than the carrier transistor IC(s) by some multiplier. For example, the peaking transistor IC(s) may be twice the size of the carrier transistor IC(s) such that the peaking transistor IC(s) have approximately twice the current carrying capability of the carrier transistor IC(s). Peaking-to-carrier amplifier IC size ratios other than a 2:1 ratio may be implemented, as well.

The carrier amplifier 50 of the Doherty PA circuit 30 may be biased to function in class AB mode during circuit operation, while the peaking amplifier 52 is biased to function in class C mode. At low power levels (e.g., when the power of the input signal at the node 32 is less than the turn-on threshold level of the peaking amplifier 52), the Doherty PA circuit 30 operates in a low-power or back-off mode. In the low-power (back-off) mode, the carrier amplifier 50 is typically the only amplifier supplying current to the load 44. When the power of the input signal exceeds a threshold level of the peaking amplifier 52, however, the Doherty PA circuit 30 transitions to operation in a high-power mode in which the carrier amplifier 50 and the peaking amplifier 52 supply current to the load 44 concurrently. At this point, the peaking amplifier 52 provides active load modulation at combining node 42, thereby allowing a continued, linear increase in the current of the carrier amplifier 50.

In embodiments of the Doherty PA circuit 30, input and/or output impedance matching networks 54, 56 (input MNm, output MNm) may be implemented at the input and/or at the output of the carrier amplifier 50. Similarly, input and/or output impedance matching networks 58, 60 (input MNp, output MNp) may be implemented at the input and/or at the output of the peaking amplifier 52. In each case, the matching networks 54, 56, 58, 60 may serve to incrementally increase the circuit impedance toward the load impedance and source impedance. In certain implementations, all or portions of the input and output impedance matching networks 54, 56, 58, 60 may be implemented inside a power transistor package including the carrier and/or peaking amplifiers 50, 52, as indicated in FIG. 1 by the dashed box representative of the Doherty PA package 28. In other instances, the input and output impedance matching networks 54, 56, 58, 60 may be wholly or partially implemented outside of the Doherty PA package 28, such as on a PCB (e.g., the PCB 196 or the PCB 228 described below in connection with FIGS. 8-10) or another substrate to which the Doherty PA package 28 is mounted.

In the generalized example of FIG. 1, the Doherty PA circuit 30 has a non-inverted load network configuration. Accordingly, the input-side circuit portion is configured such that an input signal supplied to the peaking amplifier 52 is delayed by 90 degrees with respect to the input signal supplied to the carrier amplifier 50 at the center frequency of operation of, for example, the Doherty PA circuit 30. To ensure arrival of the carrier and peaking input RF signals at the amplifiers 50, 52 with approximately 90 degrees of phase shift, a phase delay element 62 may be incorporated into the Doherty PA circuit 30 and provide about 90 degrees of phase delay to the peaking input signal. For example, the phase delay element 62 may include a quarter wave transmission line, or another suitable type of delay element, with an electrical length of about 90 degrees. To compensate for the resulting 90 degree phase delay difference between the carrier and peaking amplification paths 38, 40 at the inputs of the amplifiers 50, 52, thereby ensuring that the amplified signals arrive in phase at the combining node 42, the output-side circuit portion is configured to apply about a 90 degree phase delay to the signal between the output of carrier amplifier 50 and the combining node 42. This may be achieved through the provision of an additional delay element 64, which may or may not be contained in the Doherty PA package 28 itself.

While the Doherty PA circuit 30 has a non-inverted load network configuration in the illustrated embodiment, other load network configurations are possible in other implementations. For example, in alternative implementations, the Doherty PA circuit 30 may instead have an inverted load network configuration. In this case, the input-side circuit portion may be configured such that an input signal supplied to the carrier amplifier 50 is delayed by about 90 degrees with respect to the input signal supplied to the peaking amplifier 52 at the center frequency of operation of the Doherty PA circuit 30. Correspondingly, the output-side circuit portion may be configured to apply about a 90 degree phase delay to the signal between the output of peaking amplifier 52 and the combining node 42.

As noted above, the power amplifiers 50, 52, as well as portions of the impedance matching networks 30, 58, 56, 60, may be implemented in the form of the Doherty PA package 28. In this case, input and output leads of the PA package 28 may be electrically coupled to signal transmission lines (e.g., traces) provided on a substrate to which the PA package 28 is mounted; e.g., PCB 196 shown in FIGS. 8 and 9. In various implementations, the power amplifiers 50, 52 may each include a single-stage or multi-stage power transistor bonded to the substrate. The input and output matching networks 54, 56, 58, 60, or portions thereof, may be implemented as additional components within the PA package 28. Further, either or both of the power amplifiers 50, 52 may be implemented with multiple parallel amplification paths (rather than with a single amplification path) in more complex embodiments. For example, in an example asymmetric Doherty configuration, the carrier amplifier 50 may be implemented with two (or a greater number of) parallel amplification paths, while the peaking amplifier 52 is implemented with three (or some other number of) parallel amplification paths. Further, in the case of an N-way Doherty amplifier (N>2), the Doherty PA package 28 may contain multiple peaking amplifiers of differing configurations or levels. Further discussion in this regard will now be provided in conjunction with FIG. 2.

Figure 2:
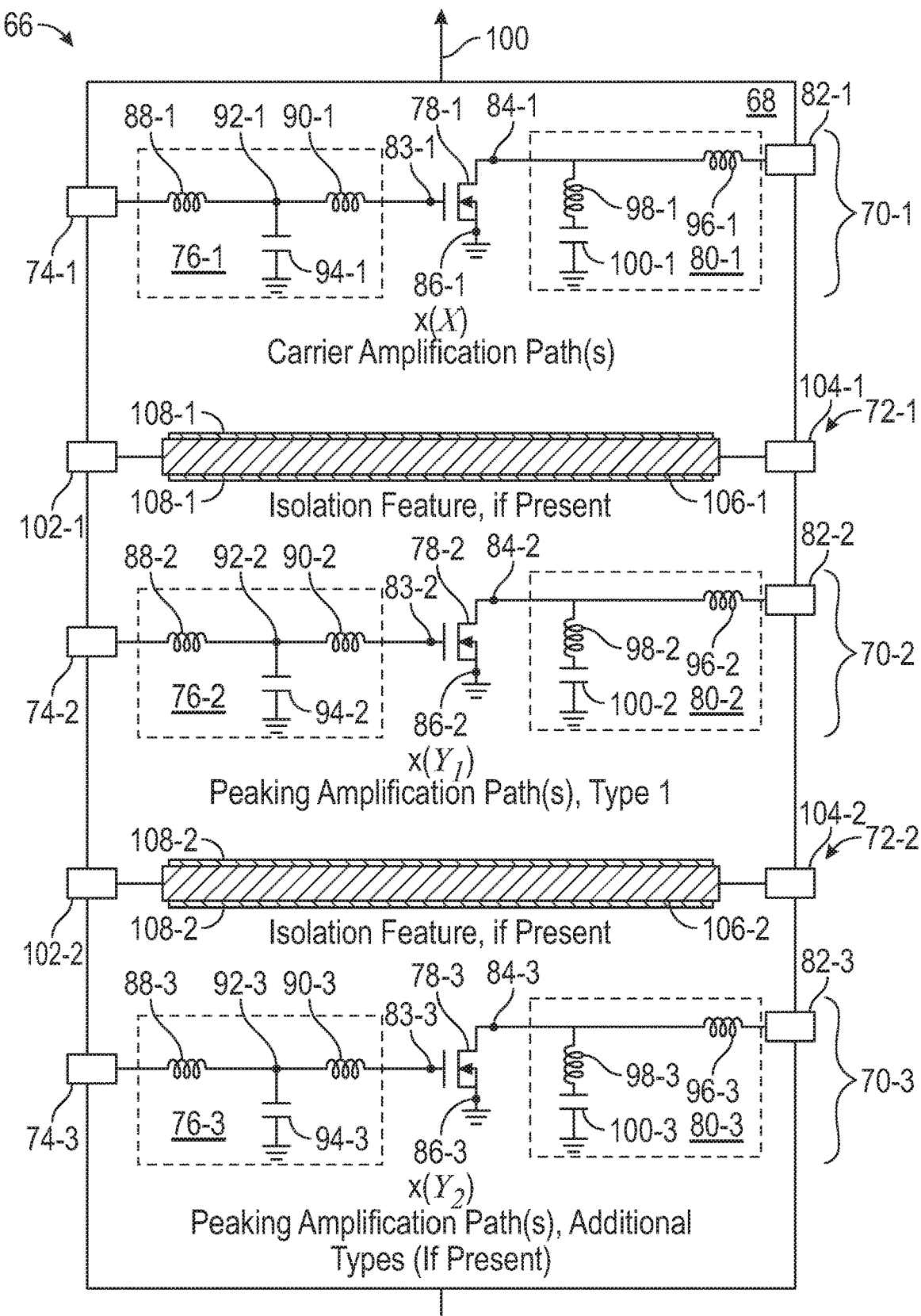
FIG. 2 is a schematic circuit diagram of parallel amplification paths suitably included in a 2-way or N-way Doherty PA package, as illustrated in accordance with an example embodiment.

Turning to FIG. 2, there is shown a schematic diagram of an example Doherty PA package 66 including a package body 68 through which multiple electrically-conductive signal amplification paths 70-1, 70-2, 70-3 extend. At least two types of signal amplification paths are provided through the Doherty PA package 66: one or more carrier (main) signal amplification paths 70-1, and one or more peaking (auxiliary) signal amplification paths 70-2, 70-3. Further, when the Doherty PA package 66 assumes the form of an N-way Doherty amplifier (N>2), the Doherty PA package 66 may contain two or more different types of peaking signal amplification paths 70-2, 70-3, often referred to as different peaking signal amplification "levels." In such instances, and as schematically indicated in FIG. 2, the N-way Doherty PA package 66 may contain: (i) a first type (or level) of peaking signal amplification path, which may include one or more individual signal amplification path(s) 70-2 extending through the Doherty PA package 66, and (ii) one or more additional types (or levels) of peaking signal amplification paths, again including any desired number of signal amplification paths 70-3. The peaking signal amplification paths 70-2, 70-3 may be routed through different transistors, phase shifted, and otherwise processed differently to produce a N-way (e.g., a 3- or 4-way) Doherty amplifier. In other instances, the Doherty PA package 66 may assume the form of a 2-way Doherty amplifier, and the peaking amplifications path(s) 70-3 may be omitted.

The Doherty PA package 66 can include any practical number of carrier signal amplification paths 70-1 (designated as "X") extending in parallel through the package 66. When the Doherty PA package 66 includes two or more carrier signal amplification paths 70-1, the illustrated circuit structure may repeat for each instance of the carrier signal amplification path 70-1. Similarly, the Doherty PA package 66 can include any practical number of carrier signal amplification paths 70-2, 70-3 of a first (and possibly only) type or level. This may be expressed by stating that the Doherty PA package 66 includes "$Y_1$" number of peaking signal amplification paths 70-2 of the first type. If the Doherty PA package 66 includes one or more peaking signal amplification paths 70-3 of additional (second and possibly third) types, it may further be stated that the Doherty PA package includes "$Y_2$" number of peaking signal amplification paths 70-3 for each additional signal amplification path type. When the Doherty PA package 66 assumes the form of an N-way Doherty amplifier containing two or more peaking signal amplification path types, the number of signal amplification paths of each type may be equal such that $Y_1=Y_2$. Further, when the N-way Doherty amplifier has a symmetric layout, the number of carrier signal amplification paths may be selected such that $X=Y_1=Y_2$. Conversely, when the N-way Doherty amplifier has an asymmetric layout, the number of carrier signal amplification paths may be selected such $X<Y_1=Y_2$. In still further instances wherein the Doherty PA package 66 has a two-way Doherty amplifier topology, the PA package 66 may lack additional peaking signal amplification paths 70-3, while $Y_1$ may be equal to X (in the case of a symmetric Doherty circuit structure) or greater than X (in the case of an asymmetric Doherty circuit structure).

The circuit structure for each of the signal amplification paths 70-1, 70-2, 70-3 may be generally similar, as schematically indicated in FIG. 2. The following description thus applies equally to each amplification path 70-1, 70-2, 70-3, with common reference numerals utilized to denote like elements. The previously-introduced numbering scheme is continued below such that the suffix "-1" is appended to reference numerals identifying circuit elements located in carrier signal amplification path(s) 70-1, while the suffix "-2" is appended to reference numerals identifying circuit elements located in peaking signal amplification path(s) 70-2. Similarly, the suffix "-3" is appended to reference numerals identifying circuit elements located in any peaking signal amplification path(s) 70-3 of additional types or levels, if included in the Doherty PA package 66. Also, in the following description, the aforementioned suffixes are omitted when generally referring to the same type of circuit element (or other feature) common across all amplification paths 70-1, 70-2, 70-3.

Each signal amplification path of the example Doherty PA package 66 includes a package input 74 (e.g., a first electrically-conductive package terminal or lead of the package 66), an input impedance matching circuit 76, at least one power transistor 78, an output impedance matching circuit 80, and a corresponding package output 82 (e.g., a second electrically-conductive package terminal or lead of the package 66). Addressing first the power transistor 78, the transistor 78 may be the primary active component of each amplification path. Each transistor 78 includes a control terminal 83 and two current-conducting terminals 84, 86. The current-conducting terminals 84, 86 of the transistor 78 are spatially and electrically separated by a variable-conductivity channel. For example, each transistor 78 may be a FET including a gate (control terminal 83), a drain (a first current-conducting terminal 84), and a source (a second current-conducting terminal 86). In various implementations, and utilizing nomenclature typically applied to FETs in a non-limiting manner, the gate 82 of transistor 78 is coupled to the input impedance matching circuit 76, the drain 84 of transistor 78 is coupled to the output impedance matching circuit 80, and the source 86 of transistor 78 is coupled to ground (or another voltage reference). Through the variation of control signals provided to the gate of transistor 78, then, the current between the current-conducting terminals of transistor 78 may be modulated, as appropriate, during operation of the Doherty PA package 66.

The input impedance matching circuit 76 is coupled between the corresponding package input 74 and the control terminal 83 (e.g., the gate) of the transistor 78. The input impedance matching circuit 76 is configured to raise the impedance of the Doherty PA package 66 to a higher impedance level, such as an impedance in a range from about 2 to about 10 Ohms or higher. This may enable a PBC-level matching interface from a non-illustrated driver stage to have an impedance achieved in high-volume manufacturing with minimal loss and variation. As indicated in FIG. 2, each input impedance matching circuit 76 may have a T-match configuration. Accordingly, the input impedance matching circuit 76 may contain two inductive elements 88, 90, such as two bond wire or wirebond arrays, and a shunt capacitance 92. The first inductive element 88 is electrically coupled between the corresponding package input 74 and a node 92, which is coupled to a first terminal of the capacitor 94. The second inductive element is coupled between the node 92 (or the first terminal of the capacitor 94) and the control terminal 83 of the transistor 78. Finally, the second terminal of the capacitor 94 may be electrically coupled to a reference voltage, such as ground.

Due to the above-described circuit arrangement, the inductive elements 88, 90 and shunt capacitance 92 collectively form a low-pass filter upstream of the transistor 78. The inductance values of the inductive elements 88, 90 and the value of the capacitance 92 will vary among embodiments. However, by way of example, the series combination of inductive elements 88, 90 may have an inductance value in a range between about 50 picohenries (pH) to about 3 nanohenries (nH), while shunt capacitance 94 may have a capacitance value in a range between about 5 picofarads (pF) to about 120 pF in embodiments. Comparatively, the shunt capacitance 92 may be selected to have a relatively large capacitance, such as a capacitance exceeding about 60 pF, to provide an acceptable RF low-impedance point. In other instances, the inductance value of the inductive elements 88, 90 and/or the capacitance of the shunt capacitance 92 may be greater or less than the aforementioned ranges.

Discussing the output-side of the Doherty PA package 66, the output impedance matching circuit 80 is coupled between the first current-conducting terminal 84 (e.g., the drain) of the transistor 78 and the corresponding package output 80. The output impedance matching circuit 80 is configured to match the output impedance of the Doherty PA package 66 with the input impedance of an external circuit or component (not shown) electrically coupled to the output 80. In embodiments, the output impedance matching circuit 80 includes at least two inductive elements 96, 98 and a shunt capacitance 100. An inductive element 96 (e.g., a third wirebond array) is coupled between the first current-conducting terminal 84 (e.g., drain) of the transistor 78 and the package output 80. A further inductive element 98 (e.g., a fourth wirebond array) is electrically coupled between the first current-conducting terminal 84 of transistor 78 and a first terminal of shunt capacitance 100. A second terminal of the shunt capacitance 100 is coupled to ground, or to another voltage reference, in the illustrated embodiment. The shunt inductive element 98 and the shunt capacitance 100 are therefore electrically coupled in series between the current-conducting terminal 84 of transistor 78 and ground. This combination of impedance matching elements functions as a first (high-pass) matching stage. By way of example, the shunt inductive element 98 may have an inductance value in a range between about 66 pH to about 3 nH. Comparatively, the shunt capacitance 100 may have a capacitance value in a range between about 30 pF to about 500 pF. These values may fall outside of the foregoing ranges in further embodiments.

In various implementations, portions of the input and output impedance matching circuits 76, 80 may be implemented as distinct or discrete components, or possibly as portions of other assemblies, such as a PCB or a low-temperature co-fired ceramic (LTCC) device. In other implementations, portions of the input and/or output impedance matching circuits 76, 80 may be coupled to and/or integrated within the semiconductor die or dies carrying the transistors 78. Some or all of the signal amplification paths 70 also may include non-illustrated bias circuitry in certain embodiments. When present, such bias circuitry may be electrically connected through one or more bias leads to an external bias circuit (not shown). Alternatively, the external bias circuits may be instead connected to the package input 74 or to the package output 80, and the bias voltage(s) may be provided through the input 74 and/or the output 80, as appropriate.

With continued reference to FIG. 2, the Doherty PA package 66 can include any number of isolation features internal to the package body or housing in embodiments. When present, such isolation features may be usefully disposed between electrically-conductive signals paths to decrease the likelihood of electrical and/or magnetic cross-coupling therebetween. Two such isolation features are shown in the illustrated example: (i) a first isolation feature 72-1 located between the carrier signal amplification path(s) 70-1 and the peaking signal amplification path(s) 70-2, as taken along a longitudinal axis of the package 66 (represented by double-headed arrow 100), and (ii) a second isolation feature 72-2 located the peaking signal amplification path(s) 70-2 and the peaking signal amplification paths 70-3, as further taken along the longitudinal axis 100. The number and position of the isolation features 72 within the Doherty PA package 66 will vary; and, in many instances, the Doherty PA package 66 may lack any such isolation features. However, when present, the isolation features 72 usefully extend between signal amplification paths prone to undesired electrical and/or magnetic cross-coupling, as further discussed below.

In accordance with embodiments of the present disclosure, the isolation features 72 (when present) may each include at least two grounded isolation leads 102, 104. In certain embodiments, each isolation feature 72 may not include additional structural elements, aside from a spacing or gap (as taken along the longitudinal axis 100) between adjacent signal amplification paths. In other instances, an isolation wall 106, 108 may be electrically coupled between the grounded leads 102, 104 to further enhance electrical and/or magnetic shielding. Each isolation wall 106, 108 may include an electrically-conductive layer, fin, or body 106, which has a wall-like form factor and which extends between adjacent die on which transistors 78 are formed. The electrically-conductive body 106 may be composed of various different electrically conductive materials, such as alloys containing one or more of the following as primary constituents by weight: cooper (Cu), nickel (Ni), aluminum (Al), silver (Ag), and gold (Au). The electrically-conductive body 106 may be electrically coupled between the isolation leads 102, 104 in certain embodiments or, instead, may be left free floating. In other embodiments, the electrically-conductive body 106 included in each isolation wall 106, 108 may be electrically coupled to ground (or to another reference voltage) through either or both of the leads 102, 104 and, therefore, may generally serve as a ground plane. In this manner, the electrically-conductive body 106 and, more generally, each electrically-conductive wall 106 may be electrically grounded through the lead pairs 102, 104 to, for example, reduce eddy currents loses, hysteresis effects, and RF mismatch (when applicable). In other embodiments, the electrically-conductive wall 106 may not be electrically grounded or may be omitted from the Doherty PA package 66 entirely.

In certain cases, one or more magnetic shield layers 108 may be bonded to or otherwise placed in contact with one or more of the electrically-conductive bodies 106 included in the isolation wall(s) 106, 108. When present, the magnetic shield layers 108 may be composed of any magnetically-permeable material having a magnetic permeability greater than the material from which the electrically-conductive bodies 106 are composed, while further having an electrical conductivity less than the electrically-conductive body 106. As appearing herein, a material is defined as "magnetically-permeable" when possessing a relative magnetic permeability ($\mu_r$) exceeding 1000. In certain embodiments, the magnetic shield layers 108 may be composed of a material having a relative magnetic permeability ($\mu_r$) exceeding 10,000. Suitable materials include, but are not limited to, metallic materials including Mu metals, Fe-based alloys (e.g., permalloy), ferrites, electrical steels, amorphous metal alloys (e.g., METGLAS®), and other alloys having relatively high magnetic permeabilities. Composite materials containing magnetically-permeable particles, fibers, or the like can also be utilized in embodiments. Further description of isolation structures suitable for usage as the isolation walls 106, 108 contained in embodiments of the Doherty PA package 66 can be found in the following reference, which is incorporated by reference: U.S. patent application Ser. No. 16/107,089, entitled "ELECTROMAGNETICALLY-SHIELDED MICROELECTRONIC ASSEMBLIES AND METHODS FOR THE FABRICATION THEREOF," and filed with the United States Patent and Trademark Office (USPTO) on Aug. 21, 2018.

Examples of the Design-Flexible Doherty PA Package Platforms and Packages

Figure 3:
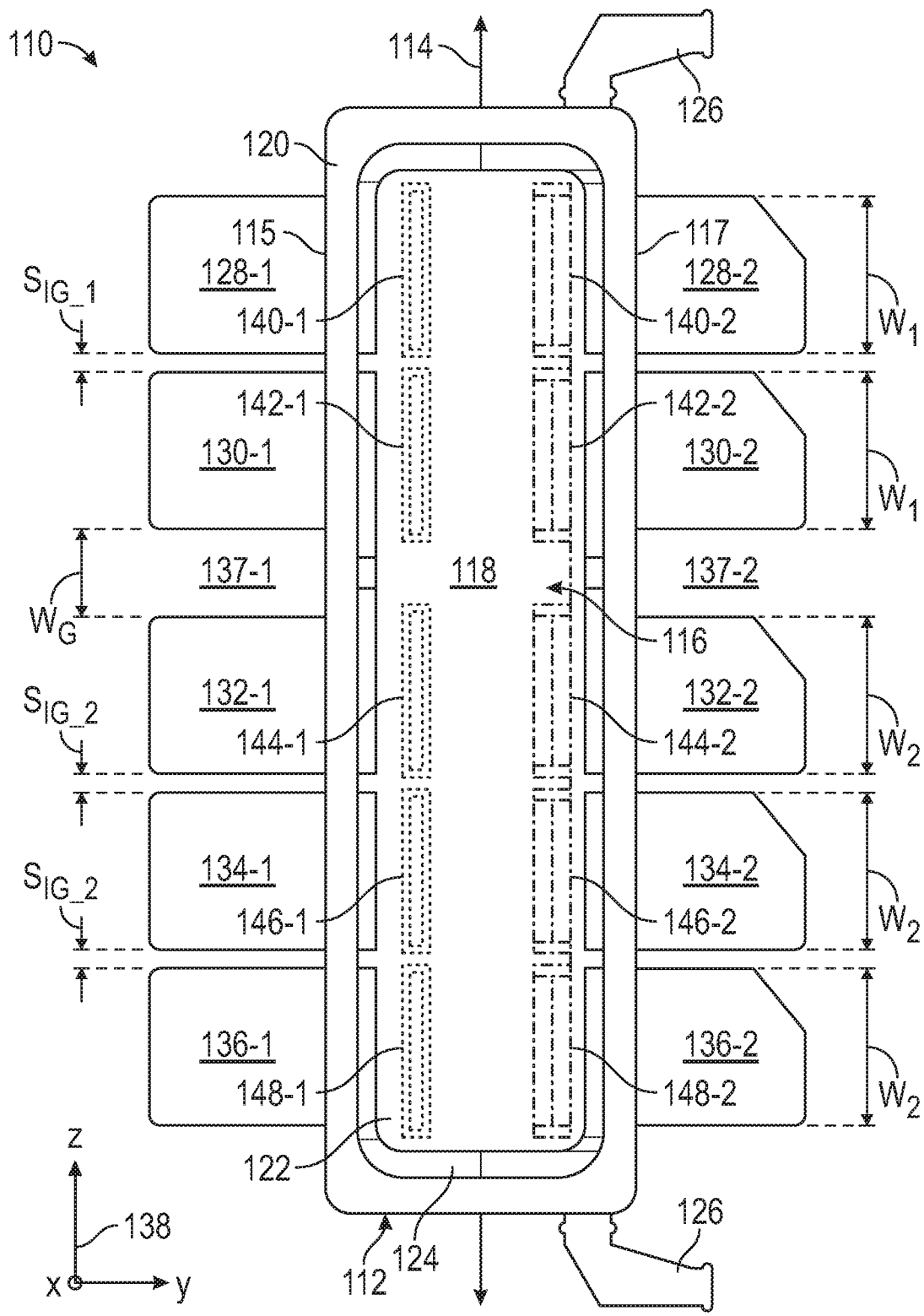
FIG. 3 is a top-down or planform view of a design-flexible PA package platform having a 10-lead form factor (excluding any bias leads), as illustrated in accordance with an example embodiment of the present disclosure.

Addressing next FIG. 3, a design-flexible PA package platform 110 is shown in a die-ready state; that is, in a state awaiting the bonding or attachment of one or more semiconductor die. In this particular example, the design-flexible PA package platform 110 assumes the form an air cavity package to which a cover piece or lid is attached to complete package fabrication, as discussed below in conjunction with FIG. 7. The instant example notwithstanding, the following description is equally applicable to all microelectronic package types amenable to usage in the fabrication of Doherty PA packages and PA packages, generally, including, for example, encapsulated or over-molded packages lacking gas-containing internal cavities. The design-flexible PA package platform 110 includes a package body 112 having a longitudinal axis 114, a first longitudinal edge portion or package side 115, and a second, opposing longitudinal side edge portion or package side 117. In instances in which the design-flexible PA package platform 110 is processed to yield a Doherty PA package, some or all of the leads extending from the package side 115 may serve as carrier and peaking input leads, while some or all leads extending from the package side 117 may serve as carrier and peaking output leads. For this reason, package sides 115, 117 are also referred to below as "input side 115" and "output side 117," respectively.

The package body 112 of the design-flexible PA package platform 110 will vary in construction among embodiments and can assume various forms without limitation. In the illustrated example, the package body 112 includes an electrically-conductive substrate or base flange 116 on which a die bond region 118 is provided. Outer package sidewalls 120 extend around an outer periphery of the upper surface of the base flange 116 to enclose or bound the outer periphery of an air cavity 122, as well as an inner peripheral ledge or bond pad shelf 124 exposed within the cavity 122. The package sidewalls 120 may be composed of a dielectric material to provide isolation between the below-described package leads and the electrically-conductive base flange 116. In certain embodiments, the package sidewalls 120 may be provided as one or more discretely-fabricated structures, such as a single piece or multi-piece window frame, positioned over the base flange 116 and bonded in place. In other instances, the package sidewalls 120 may be over-molded onto the base flange 116. In this latter case, the package sidewalls 120 may or may not be formed to extend downwardly beyond the frontside of the base flange 116 to form a lower skirt region. When present, such a skirt region may extend around the outer periphery of the base flange 116, while a lower principal surface of the flange 116 remains exposed along the backside of package body 112.

As indicated above, the base flange 116 of the design-flexible PA package platform 110 has an upper surface or frontside on which the die bond region 118 is provided for attachment of one or more transistor dies and, perhaps, other microelectronic devices installed within the package body 112. The base flange 116 can be realized as a body of material, a layered or laminated structure, or other substrate suitable for supporting such microelectronic devices. In certain embodiments, the base flange 116 may serve as a heatsink and/or an electrically-conductive terminal of the subsequently-produced PA package. By way of example, the base flange 116 may assume the form of a monolithic metallic structure, plate, or slug in certain implementations. In other implementations, the base flange 116 may have a multilayer metallic construction; e.g., base flange 116 may contain multiple thermally-conductive layers, which are bonded in a stacked or laminated arrangement. Often, the base flange 116 will be composed predominately of one or more metals having relatively high thermal conductivies, such as Cu. As a more specific example, in an embodiment wherein the base flange 116 is a layered or laminated structure, the base flange 116 may include at least one Cu layer combined with at least one disparate metal layer having a Coefficient of Thermal Expansion (CTE) less than that of the Cu layer. The disparate metal layer may be composed of, for example, Molybdenum (Mo), a Mo—Cu alloy, or a Mo—Cu composite material. In this manner, base flange 116 may be imparted with both a relatively high thermal conductivity and a lower effective CTE.

The design-flexible PA package platform 110 may be described as having a 10-lead count. The term "lead count," as appearing herein, refers to the number of signal-carrying leads included in a PA package (or package platform) excluding any bias leads, such as bias leads 126 shown in FIG. 3. In the illustrated example, the design-flexible PA package platform 110 includes a set of five input-side leads 128-1, 130-1, 132-1, 134-1, 136-1 and a corresponding set of five output-side leads 128-2, 130-2, 132-2, 134-2, 136-2. The package leads may also be discussed in terms of "laterally-aligned lead pairs" or, more simply, "lead pairs" below. Each lead pair includes two leads, which align along a lateral axis perpendicular to the longitudinal axis 114 of the package platform 110 (or a package fabricated thereon) and parallel to the Y-axis of the coordinate legend 138 in the lower left corner of FIG. 3. Utilizing this terminology, the design-flexible PA package platform 110 may also described as including the following lead pairs: a first laterally-aligned lead pair 128 consisting of leads 128-1, 128-2, a second laterally-aligned lead pair 130 consisting of leads 130-1, 130-2, a third laterally-aligned lead pair 132 consisting of leads 132-1, 132-2, a fourth laterally-aligned lead pair 134 consisting of leads 134-1, 134-2, and a fifth laterally-aligned lead pair 136 consisting of leads 136-1, 136-2.

Collectively, the input-side leads 128-1, 130-1, 132-1, 134-1, 136-1 form a first (input-side) lead array, while the output-side leads 128-2, 130-2, 132-2, 134-2, 136-2 form a second (output-side) lead array. In the illustrated example, the input-side lead array and the output-side lead array are each arranged in two clusters or groupings; the term "grouping" and the term "group," as appearing herein, are utilized interchangeably in reference to two or more leads having a relatively close spacing taken along a longitudinal axis of a PA package or package platform (e.g., along the longitudinal axis 114 of the PA package platform 110 in FIG. 3) as compared to at least one other lead or group of leads further included in the PA package or package platform. Addressing first the input-side lead array containing package leads 128-1, 130-1, 132-1, 134-1, 136-1, the input-side lead array is spatially distributed as two groups: (i) a first input-side lead group containing leads 128-1, 130-1, and (ii) a second input-side lead group containing leads 132-1, 134-2, 136-2. The input-side lead group containing leads 128-1, 130-1 may alternatively be referred to as the "second input-side lead group," while the input-side lead group containing leads 132-1, 134-1, 136-1 may alternatively be referred to as the "first input-side lead group" in certain instances, depending upon the order in which these lead groups are introduced.

Figure 4:
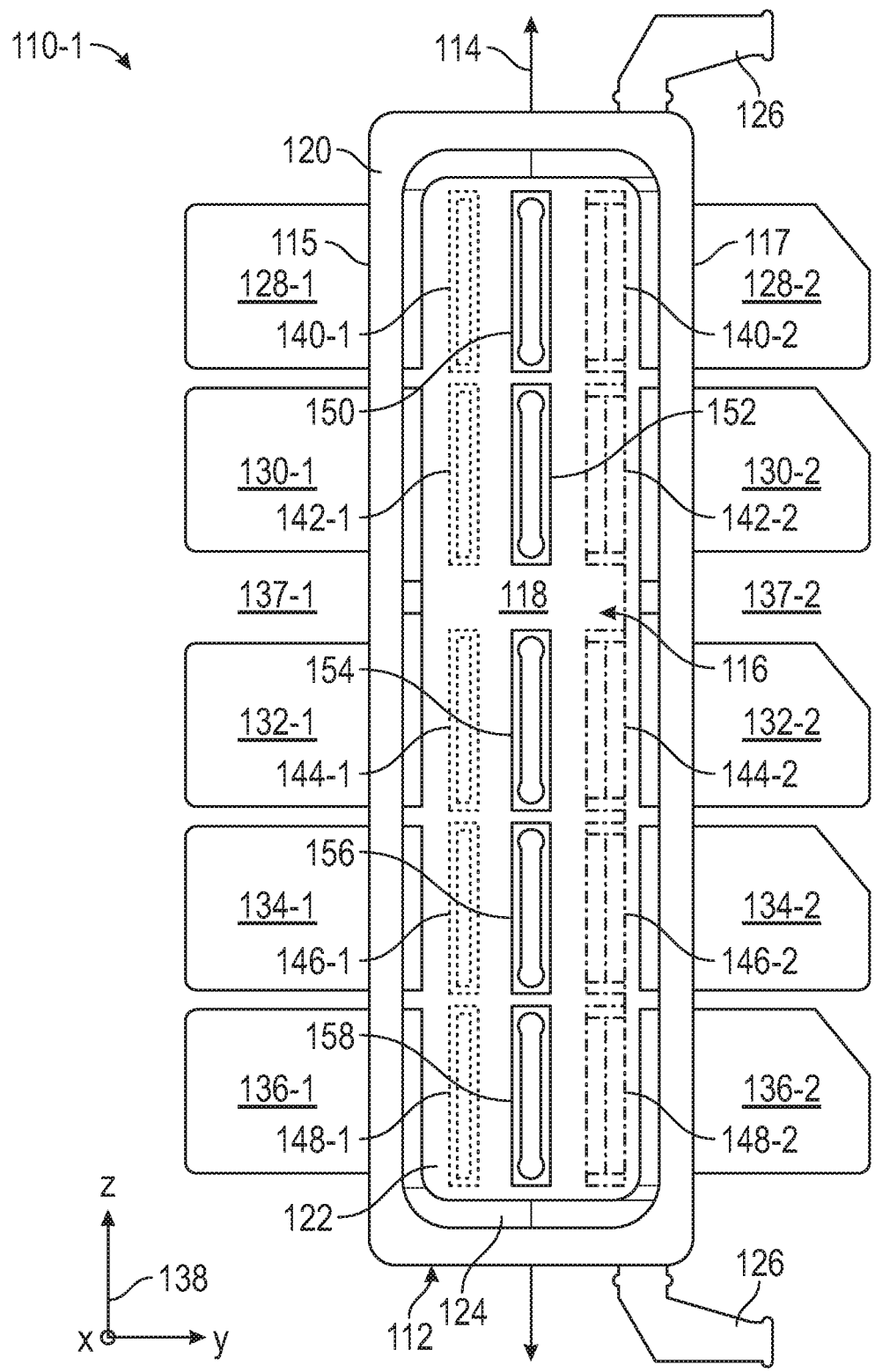
FIGS. 4 and 5 are planform views of a 10-lead Doherty PA package produced utilizing the design-flexible PA package platform shown in FIG. 3 having a first (two-way, five-path, asymmetric) Doherty PA configuration, shown at various stages of completion, and illustrated in accordance with an example embodiment of the present disclosure.

With continued reference to FIG. 4, the leads in the first (or second) input-side lead group (leads 128-1, 130-1) are separated or offset by a first (or second) intra-group (IG) lead spacing, as taken along the longitudinal axis 114 of the design-flexible PA package platform 110. The first IG lead spacing is identified by arrows "$S_{IG\_1}$" in the upper right of FIG. 3. Similarly, the leads in the second (or first) input-side lead group (132-1, 134-1, 136-1) are separated by a second (or first) intra-group lead spacing, as taken along the longitudinal axis 114 and identified by arrows "$S_{IG\_2}$." In the illustrated example, the first and second IG lead spacings are substantially equivalent such that $S_{IG\_1} \approx S_{IG\_2}$; the term "substantially equivalent," as appearing herein, defined as differing by a disparity of less than 10%. In other embodiments, $S_{IG\_1}$ and $S_{IG\_2}$ may not be substantially equivalent such that $S_{IG\_1}$ exceeds $S_{IG\_2}$ or, conversely, such that $S_{IG\_2}$ exceeds $S_{IG\_1}$.

The first input-side lead group (closely-spaced leads 128-1, 130-1) and the second input-side lead group (closely-spaced leads 132-1, 134-1, 136-1) are separated by an enlarged input-side isolation gap 137-1. The isolation gap 137-1 is "enlarged" in the sense that the isolation gap 137-1 has a width exceeding the IG lead spacings. In this regard, the example design-flexible PA package platform 110 shown in FIG. 3 is dimensioned such that the input-side isolation gap 137-1 has a predetermined width taken along the longitudinal axis 114 and identified by double-headed arrow "$W_G$." In various embodiments, the width of the input-side isolation gap 137-1 is greater than both the first IG lead spacing ($S_{IG\_1}$) and the second IG lead spacing ($S_{IG\_2}$). Further, in many instances, the width of the input-side isolation gap 137-1 may be at least 50% greater than the first IG lead spacing ($S_{IG\_1}$) and at least 50% greater than the second IG lead spacing ($S_{IG\_2}$); again, noting that $S_{IG\_1}$ and $S_{IG\_2}$ may or may not be substantially equivalent.

The above-described grouped-lead spacing scheme may help minimize the footprint of the design-flexible PA package platform 110 and any PA package produced therewith, while reducing cross-coupling between carrier and peaking signal amplification paths. Additionally, providing multiple discrete package leads 128-1, 130-1 (rather than providing a first larger unitary lead in place of leads 128-1, 130-1) and multiple discrete package leads 132-1, 134-1, 136-1 (rather than providing a second larger unitary lead in palace of leads 132-1, 134-1, 136-1) may favorably enhance design flexibility, improve uniformity in current distribution during operation of a PA package fabricated utilizing the PA package platform 110, and provide other benefits. These advantages notwithstanding, the design-flexible PA package platform 110 may not include the enlarged input-side isolation gap 137-1 in all instances, in which case the package leads 128-1, 130-1 132-1, 134-1, 136-1 may be spaced at regular intervals along the longitudinal axis 114 of the PA package platform 110.

The foregoing description of the package leads and lead groups included in the input-side lead array is equally applicable to the package leads and lead groups included in the output-side lead array of the PA package platform 110. Thus, in a like manner, the output-side leads 128-2, 130-2, 132-2, 134-2, 136-2, which form the output-side lead array of the PA package platform 110, are separated into two groups: (i) a first (or second) output-side lead group containing leads 128-2, 130-2, and (ii) a second (or first) lead output-side lead group containing leads 132-2, 134-2, 136-2. The leads 128-2, 130-2 within the first output-side lead group are separated by the above-described first IG (intra-group) lead spacing ($S_{IG\_1}$), while the leads 132-2, 134-2, 136-2 within the second output-side lead group are separated by the second IG lead spacing ($S_{IG\_2}$). Such an identical or bilaterally symmetrical lead spacing between the input-side lead array and the output-side lead array ensures that the leads in the lead pairs 128, 132, 132, 134, 136 are laterally aligned, as previously mentioned. Additionally, in a manner analogous to the above-discussed input-side lead groups, the first and second output-side lead groups are separated or offset by an enlarged output-side isolation gap 137-2 having the above-specified gap width ($W_G$). Thus, as discussed above, the design-flexile PA package platform 110 may be dimensioned such that the gap width of the output-side isolation gap 137-2 ($W_G$) exceeds and, perhaps, is at least 50% greater than both the first IG lead spacing ($S_{IG\_1}$) and the second IG lead spacing ($S_{IG\_2}$), which are conveniently, although not necessarily substantially equivalent.

In embodiments, the leads 128-1, 130-1 in the first input-side lead group and the leads 128-2, 130-2 in the first output-side lead group may have substantially equivalent maximum lead widths (as considered external to the package body 112). This may be appreciated by referring to the dimensional call-outs "$W_1$" appearing in an upper right region of FIG. 3 identifying the respective maximum widths of leads 128-2, 130-2, which may be equivalent to the maximum widths of leads 128-1, 130-1. These lead maximum widths, and all other lead widths mentioned in this document, are measured along the longitudinal axis of referenced package or package platform (e.g., the longitudinal axis 114 of the package platform 110) at a maximum width of each lead external to the package body of the PA package or package platform in question, such as the package body 112 shown in FIG. 3. Similarly, the leads in lead pairs 132, 134, 136 may be dimensioned to possess identical maximum widths, which are equivalent to the second predetermined lead width identified by arrows "$W_2$" appearing in the lower right region of FIG. 3. Stated differently, each lead 132-1, 134-1, 136-1 in the second input-side lead group and each lead 132-2, 134-2, 136-2 in the second output-side lead group may have substantially equivalent maximum lead widths ($W_2$) in embodiments. Further, in at least some implementations, all leads in the input-side lead array and all leads in the output-side lead array (and, therefore, all leads in the first input-side group, the second input-side group, the first output-side group, and the second output-side group) may have substantially equivalent maximum lead widths (again, considered external to the package body 112) such that $W_1 \approx W_2$. In such instances, the input-side lead array and the output-side lead array may be referred to as "uniform-width lead arrays" when the package leads making-up the lead arrays have equivalent (or substantially equivalent) maximum widths. In other instances, the respective widths of the leads contained in the input-side lead array and/or the output-side lead array may vary.

The design-flexible PA package platform 110 may be fabricated to include one or more IPDs in certain embodiments. In the illustrated example, the design-flexible PA package platform 110 includes ten IPDs contained within the package body 112: five input-side IPDs 140-1, 142-1, 144-1, 146-1, 148-1, and five output-side IPDs 140-2, 142-2, 144-2, 146-2, 148-2. In a manner analogous to the package leads, the input-side IPDs 140-1, 142-1, 144-1, 146-1, 148-1 align with the output-side IPDs 140-2, 142-2, 144-2, 146-2, 148-2 to form five IPD pairs 140, 142, 144, 146, 148. The IPD pairs 140, 142, 144, 146, 148 are spaced along axes parallel to the longitudinal axis 114 and laterally align with lead pairs 128, 130, 132, 134, 136, respectively. In various embodiments, the IPDs in IPD pairs 140, 142, 144, 146, 148 may assume the form of integrated capacitors. The integrated capacitors may be coupled to ground through the base flange 116 when the design-flexible PA package platform 110 is processed to produce a complete PA package, which is deployed within a PA system. IPDs 140-1, 142-1 may thus correspond to the input-side capacitor 94-1 shown in FIG. 2, while IPDs 144-1, 146-1, 148-1 correspond to the input-side capacitor 94-2. Similarly, IPDs 140-2, 142-2 may correspond to the output-side capacitor 100-1 shown in FIG. 2; while IPDs 144-2, 146-2, 148-2 correspond to the input-side capacitor 100-2 further shown in FIG. 2. In other instances, one or more of IPDs 140, 142, 144, 146, 148 may be omitted from the PA package platform 110; or may be replaced by discrete passive devices, such as chip caps or other Surface Mount Devices (SMDs).

Advancing to FIG. 4, the design-flexible PA package platform 110 is illustrated following die attachment. Here, five power transistor IC dies 150, 152, 154, 156, 158 (hereafter, "transistor dies 150, 152, 154, 156, 158") have been bonded or otherwise attached to the die bond region 118 of the base flange 116 at selected locations spaced along the longitudinal axis 114. At this juncture of manufacture, a desired configuration of the PA package platform 110 has been established and utilized to determine the number, type, and positioning of the transistor dies 150, 152, 154, 156, 158 installed within the design-flexible PA package platform 110. Here, it has been determined that the design-flexible PA package platform 110 should be processed to produce a Doherty PA package having a two-way, five-path, asymmetric Doherty PA configuration. For this reason, the design-flexible PA package platform 110 is identified by reference numeral "110-1" in FIG. 4, with the suffix "-1" designating a particular package configuration. This numbering scheme is also carried-over through FIGS. 5-7 below. In other embodiments, Doherty PA packages having different configurations may be fabricated utilizing the design-flexible PA package platform 110, with several additional examples further discussed below in connection with FIGS. 11-13.

Progressing from top to bottom in FIG. 4, the first transistor die 150 may be mounted to an upper portion of the die bond region 118 of the base flange 116. The transistor die 150 is positioned to laterally align with the input-side lead 128-1 and the output-side lead 128-2. The transistor die 150 may or may not have a width substantially equivalent to the maximum lead widths of the leads included in the lead pair 128. Similarly, the second transistor die 152 is joined to the die bond region 118 of the base flange 116 at a location laterally align with the input-side lead 130-1 and the output-side lead 130-2. Again, the second transistor die 152 may or may not have a width substantially identical to the maximum lead widths of the correspond lead pair 130. In the illustrated example, at least one carrier transistor may be provided on each transistor die 150, 152 (analogous to transistors 78-1 in FIG. 2) such that the dies 150, 152 cooperate with the corresponding lead pairs 128, 130 (and the IPDs 140, 142, when present) to form two parallel carrier signal amplification paths through the PA package 110-1, as described below in connection with FIG. 5. For this reason, the transistor dies 150, 152 are referred to hereafter as "carrier PA dies 150, 152," respectively. In other instances, the carrier PA dies 150, 152 may vary in width or positioning; and/or the dies 150, 152 may be replaced with a single transistor die, which bears two (or more) carrier transistors disposed in a side-by-side relationship.

Continuing to progress from top to bottom in FIG. 4, the third transistor die 154 is attached to the die bond region 118 of the base flange 116 at a location laterally aligned with the input-side lead 132-1 and the output-side lead 132-2; the fourth transistor die 156 is attached to the die bond region 118 at a location laterally aligned with the input-side lead 134-1 and the output-side lead 134-2; and the fifth transistor die 158 is attached to the die bond region 118 at a location laterally aligned with the input-side lead 136-1 and the output-side lead 136-2. In embodiments, at least one peaking transistor may be provided on each transistor die 154, 156, 158 analogous to transistors 78-2 schematically shown in FIG. 2. Accordingly, the transistor dies 154, 156, 158 cooperate with corresponding lead pairs 132, 134, 136 (and IPDs 144, 146, 148, when present) to form three parallel peaking signal amplification paths through the Doherty PA package 110-1, as considered in the completed state shown in FIG. 7 (described below). For this reason, the transistor dies 154, 156, 158 are referred to more specifically below as "the peaking PA dies 154, 156, 158."

The peaking dies 154, 156, 158 may have widths substantially equivalent to the maximum widths of the package leads in lead pairs 132, 134, 136, respectively, in embodiments. In other instances, this may not be the case. The cumulative die bond area to which the peaking PA dies 154, 156, 158 are attached (that is, the surface area of the die bond region 118 covered by the PA dies 154, 156, 158) exceeds the cumulative die bond area occupied by the carrier PA dies 150, 152. The transistors provided on the peaking PA dies 154, 156, 158 may thus have a cumulative size exceeding the cumulative size of the transistors provided on the carrier PA dies 150, 152. The Doherty PA package 110-1 is consequently imparted with an asymmetrical layout in the illustrated embodiment to enable performance improvements through a cumulative enlargement of the peaking transistors within the Doherty PA package 110-1. In other instances, the peaking PA dies 154, 156, 158 may be replaced with one or two transistor dies on which multiple transistors are formed. Indeed, all of the illustrated transistor die 152, 154, 156, 158 can be replaced by a single die bearing both peaking and carrier transistors in alternative embodiments of the Doherty PA package 110-1.

Figure 5:
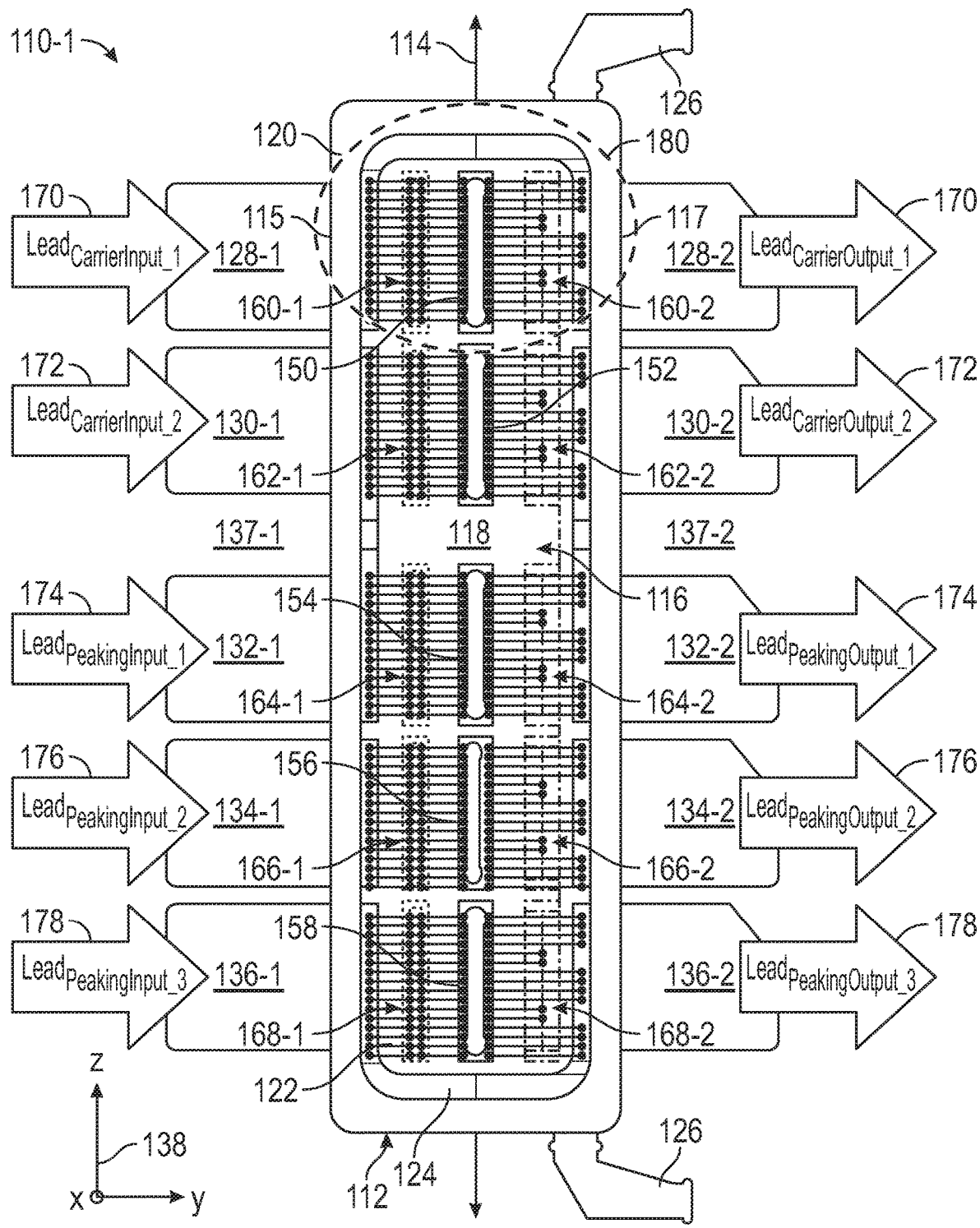

FIG. 5 illustrates the Doherty PA package 110-1 following electrical interconnection to complete the desired wiring architecture of the package. In this particular example, bond wire formation or "wirebonding" is utilized to form the desired electrical interconnections; however, in other instances, a different interconnection technique can be utilized as an alternative to, or in combination with, wirebonding. Pursuant to the wirebonding process, several input-side wirebond arrays 160-1,162-1,164-1,166-1,168-1 and a corresponding number of several output-side wirebond arrays 160-2, 162-2, 164-2, 166-2, 168-2 have been produced to electrically interconnect the transistor dies 152, 154, 156, 156, 158; the IPDs 140, 142, 144, 146, 148; and the lead pairs 128, 130, 132, 134, 136 to complete the below-described signal amplification paths. Specifically, the formation of wirebond array pairs 160, 162, 164, 166, 168 completes a number of signal carrying paths through the Doherty PA package 110-1, as represented by arrow pairs 170, 172, 174, 176, 178. In the present example, these paths include a first carrier signal amplification path (represented by arrows 170 in FIG. 5), a second carrier signal amplification path (represented by arrows 172), a first peaking signal amplification path (represented by arrows 174), a second peaking signal amplification path (represented by arrows 176), and a third peaking signal amplification path (represented by arrows 178).

The carrier signal amplification paths 170, 172 extend through the Doherty PA package 110-1 in parallel. The carrier PA dies 150, 152 are positioned in the paths 170, 172, respectively, to provide the signal amplification functionality discussed above in connection with FIGS. 1 and 2. Similarly, the carrier amplification paths 170, 172 likewise extend through the Doherty PA package 110-1 in parallel, with the peaking PA dies 154, 156, 158 positioned in the paths 174, 176, 178, respectively, to provide the desired signal amplification functionality. Referring briefly again to FIG. 2 in combination with FIG. 5, during operation of the Doherty PA package 110-1, the wirebond arrays 160, 162 provide the inductances corresponding to symbols 88-1, 90-1, 98-1, 96-1. Accordingly, the combination of the lead pairs 128, 130; the wirebond arrays 160, 162; the IPDs 140, 142; and the transistor die 150, 152 form two instances of the circuit structure generally corresponding to the carrier signal amplification path 70-1 (FIG. 2). Similarly, the wirebond arrays 164, 166, 168 provide the inductances represented by symbols 88-2, 90-2, 98-2, 96-2 (FIG. 2). The combination of the lead pairs 132, 134, 136; the wirebond arrays 164, 166, 168; the IPDs 144, 146, 148; and the transistor die 154, 156, 158 thus form three instances of the circuit structure corresponding to the peaking amplification paths 70-2 in FIG. 2.

Figure 6:
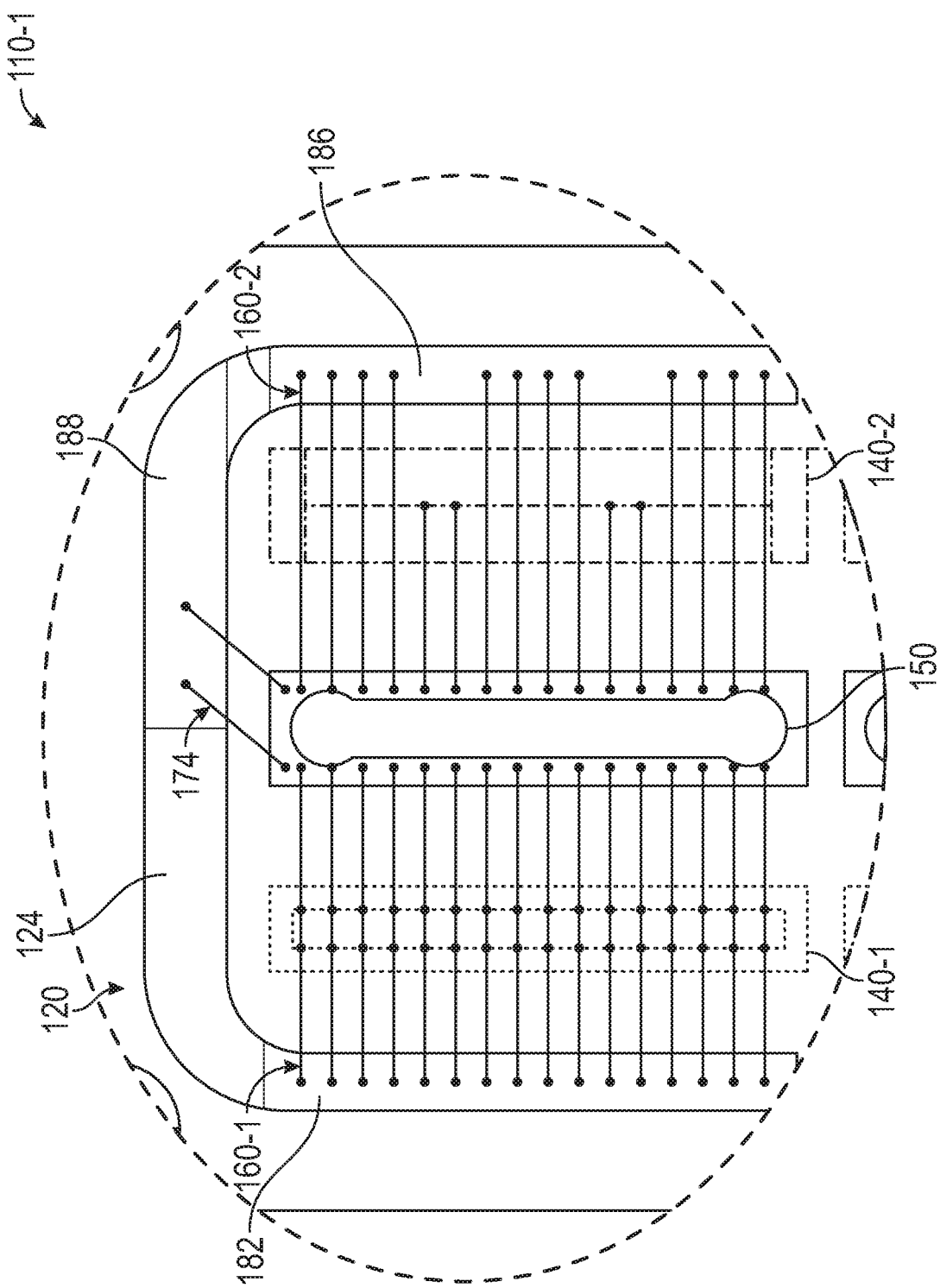
FIG. 6 is a detailed planform view of a region of the example 10-lead Doherty PA package shown in FIG. 5 after electrical interconnection by wire bonding.
Figure 7:
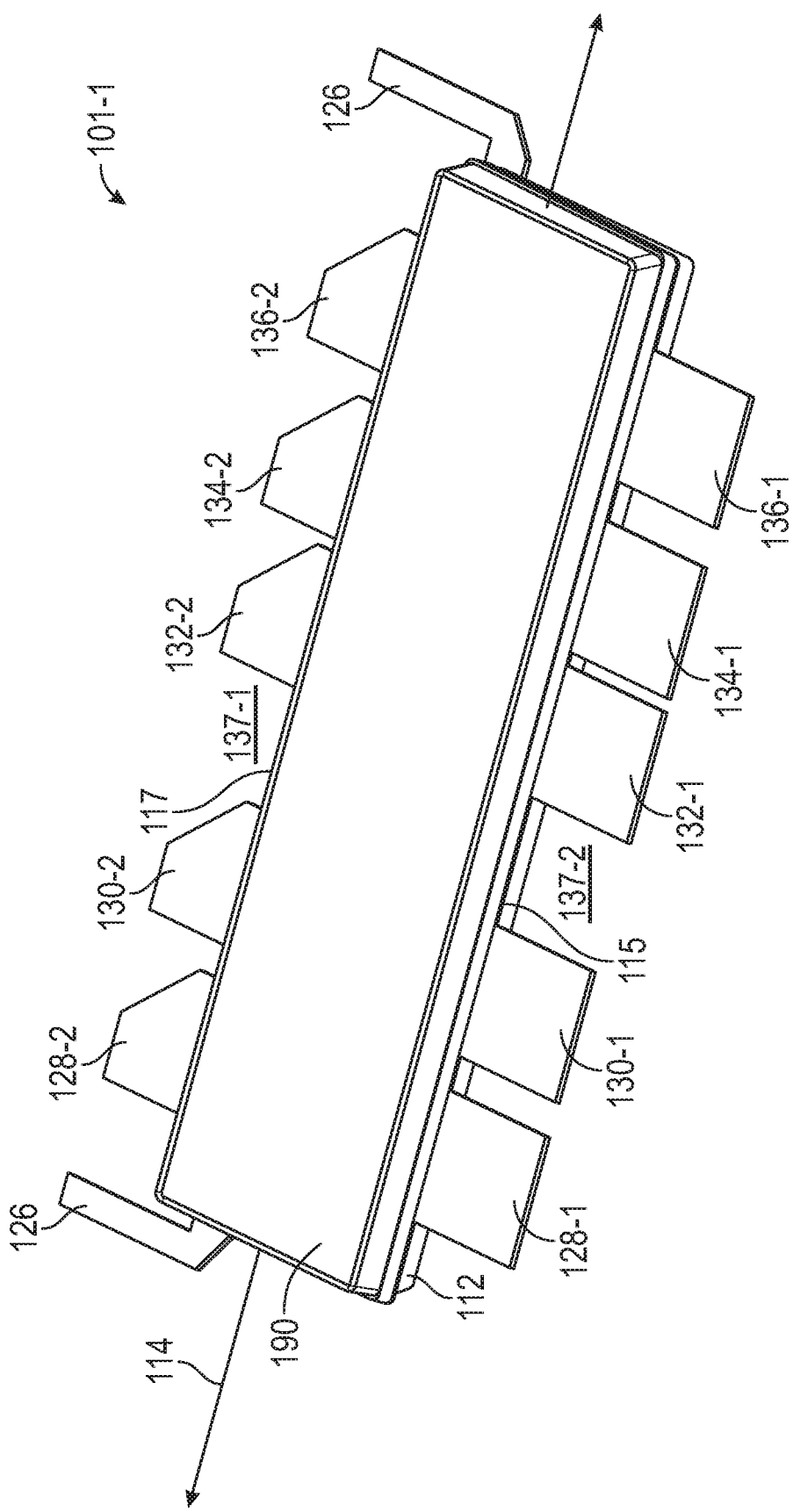
FIG. 7 is an isometric view of the 10-lead Doherty PA package shown in FIGS. 4-6 following attachment of a lid or cover piece completing fabrication of the Doherty PA package.

FIG. 6 illustrates a limited region of the Doherty PA package 110-1, which corresponds to a detail bubble 180 in FIG. 5 and which contains wirebond arrays 160-1, 160-2. Referring collectively to FIGS. 3-6, selected wirebonds in the input-side wirebond array 160-1 are formed between an inner edge 182 of the carrier signal input lead 128-1 (exposed along the bond pad shelf 124) and the input-side IPD 140-1. Additional wirebonds are formed between the IPD 140-1 and bond pads provided along a frontside edge of the carrier PA die 150. Similarly, selected wirebonds in the output-side wirebond array 160-2 extend from bond pads provided on the carrier PA die 150 to the output-side IPD 140-2. Other wirebonds extend from the carrier PA die 150 to an inner edge 186 of the carrier signal output lead 128-2 exposed along the bond pad shelf 124 to complete the carrier signal amplification path 170 (FIG. 5). Finally, certain bond pads on the illustrated carrier PA die 150 (or perhaps other bias circuitry) may also be bonded to an exposed inner edge 188 of the bias lead 126 shown in the upper portion of FIGS. 3-5. Similar wirebonds or electrical interconnections are further formed to complete the other signal amplification paths 172, 174, 176, 178, as appropriate.

After bondwire formation, a lid or cover piece 190 is attached to the upper peripheral edge of the peripheral wall 120 to enclose the transistor die 150, 152, 154, 156, 158; wirebond arrays 160, 162, 164, 166, 168; and other internal features of the Doherty PA package 110-1. Lid attachment may be performed under pressure, temperature, and atmospheric conditions and utilizing a bonding material (e.g., a sintered material, an epoxy, or a die attachment material) appropriate to trap a desired pressure and atmosphere within the air cavity package. Lid attachment completes fabrication of the Doherty PA package 110-1 to yield the final package shown in FIG. 7. The completed Doherty PA package 110-1 features an asymmetric, two-way, five-path circuit topology or configuration, which may provide increases in gain, linearity, stability, and power-added efficiency levels; and/or other performance benefits. Further, in contrast to conventional Doherty PA packages having fewer (e.g., variable width) leads, each dedicated to transmitting a particular signal type, embodiments of the Doherty PA package 110-1 decrease the likelihood of cross-coupling or cross-talk between signal paths by, for example, distancing the overall combined current applied across the PA package 110-1 from the power devices therein. This benefit may be enhanced when the Doherty PA package 110-1 is mounted to a substrate having corresponding pronged or branched interconnect features, such as branched printed traces or transmission lines; and/or when utilized with a fingered isolation device matingly installed over and around the PA package 110-1, as discussed more fully below in connection with FIGS. 8 and 9.

Figure 8:
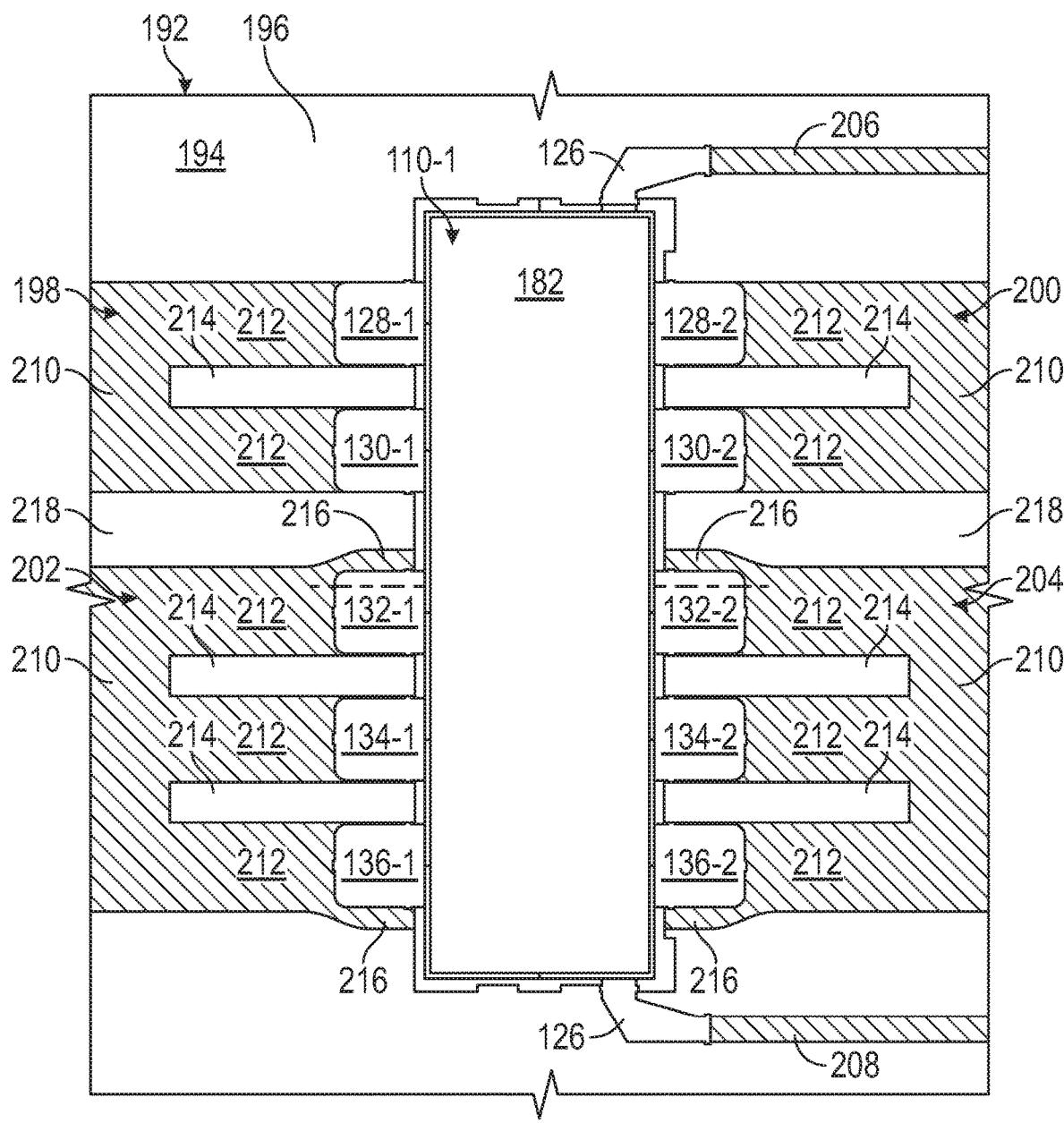
FIG. 8 is a planform view of a first example PA system including the 10-lead Doherty PA package shown in FIGS. 3-7 installed on a substrate, such as a PCB (partially shown), having branched transmission lines.

FIG. 8 is a planform view of an example Doherty PA system 192 in which the example 10-lead Doherty PA package 110-1 is suitably deployed. The Doherty PA package 110-1 is soldered or otherwise mounted to the upper surface 194 of a PCB 196, or another substrate, having certain electrical routing features for electrical interconnection to the package leads. In particular, a network of electrically-conductive interconnect features (here, a plurality of signal transmission lines 198, 200, 202, 204, 206, 208) is formed on the upper surface 194 of the PCB 196. The transmission lines 198, 200, 202, 204 may be formed in relatively close proximity and extend to the lead pairs 128, 130, 132, 134, 136 when the Doherty PA package 110-1 is properly positioned on the PCB 196. Electrical isolation between the adjacent transmission lines 198, 200 and the adjacent transmission lines 198, 200 is maintained by a spacing or clearance 218, as taken along the longitudinal axis of the PA package 110-1. The transmission lines 206, 208 further contact the bias leads 126, which extend from opposing end portions of the Doherty PA package 110-1 when the PA package 110-1 is mounted to the PCB 196. In other embodiments, the bias leads 126 and transmission lines 206, 208 may be omitted.

In the example of FIG. 8, the transmission lines 198, 200,202,204 are each imparted with a fingered, pronged, or branched form factor. In particular, each transmission line 198, 200, 202, 204 includes an elongated primary body 210 (only a limited portion of which is shown), which divides into and terminates in a number of transmission line branches 212 (more generally referred to as "interconnect line branches 212"). The transmission line branches 212 are separated by isolation gaps or notches 214, which are interspersed with the transmission line branches 212 and which extend to the Doherty PA package 110-1 when mounted to the PCB 196. The widths of the isolation notches 214 may vary, as may the dimensions and geometry of the transmission line branches 212; however, in one embodiment, the isolation notches 214 may each have a width less than the gap width ($W_G$) of the package lead isolation gaps 137. In other embodiments, the isolation notches 214 extending between the leads 128-1, 128-2, 130-1, 130-2 and may each have a width substantially equivalent to the first IG lead spacing ($S_{IG\_1}$); while the isolation notches 214 extending to the leads 132-1, 132-2, 134-1, 134-2, 136-1, 136-2 may each have a width substantially equivalent to the second IG lead spacing ($S_{IG\_2}$) and possibly to the first IG lead spacing ($S_{IG\_1}$).

Imparting the transmission lines 198, 200, 202, 204 with branched geometries similar or identical to those shown in FIG. 8 may provide certain benefits, such as improving uniformity in current distribution and/or reducing internal coupling within the Doherty PA package 110-1 by distancing the location at which the carrier and peaking signals are merged relative to the location of the PA package 110-1 itself. Such benefits may be enhanced in certain instances (e.g., when at least some branched transmission lines contain three or more branches) by varying the respective widths of certain branches (e.g., the outer transmission line branches 212) relative to the other branch(es) (e.g., the center or intermediate transmission line branch 212). This may be appreciated more fully by referring to branched transmission line lines 202, 204 appearing in the lower portion of FIG. 8. The outer branches 212 of the transmission lines 204 are imparted with an increased thickness adjacent the leads 132-1, 132-2, 136-1, 136-2; e.g., the outer branches 212 may be patterned or otherwise produced to include widen or "flared-out" regions adjacent the leads 132-1, 132-2, 136-1, 136-2 and opposite the isolation notches 214. As a result, the average width of the upper and lower transmission line branches 212 exceeds the average width of the intermediate branch 212 (located between the upper and lower branches 212) contained in the branched transmission line 202 in the illustrated embodiment. So too does the average width of the upper and lower transmission line branches 212 exceed the average width of the intermediate transmission line branch 212 included in the branched transmission line 204 contacting the package leads 132-2, 134-2, 136-2. When present, such a variable-width geometry of the branched transmission line sets may help reduce impedance toward the outer edges of the branched transmission lines 202, 204 to further improve current distribution uniformity during operation of the Doherty PA package 110-1.

Figure 9:
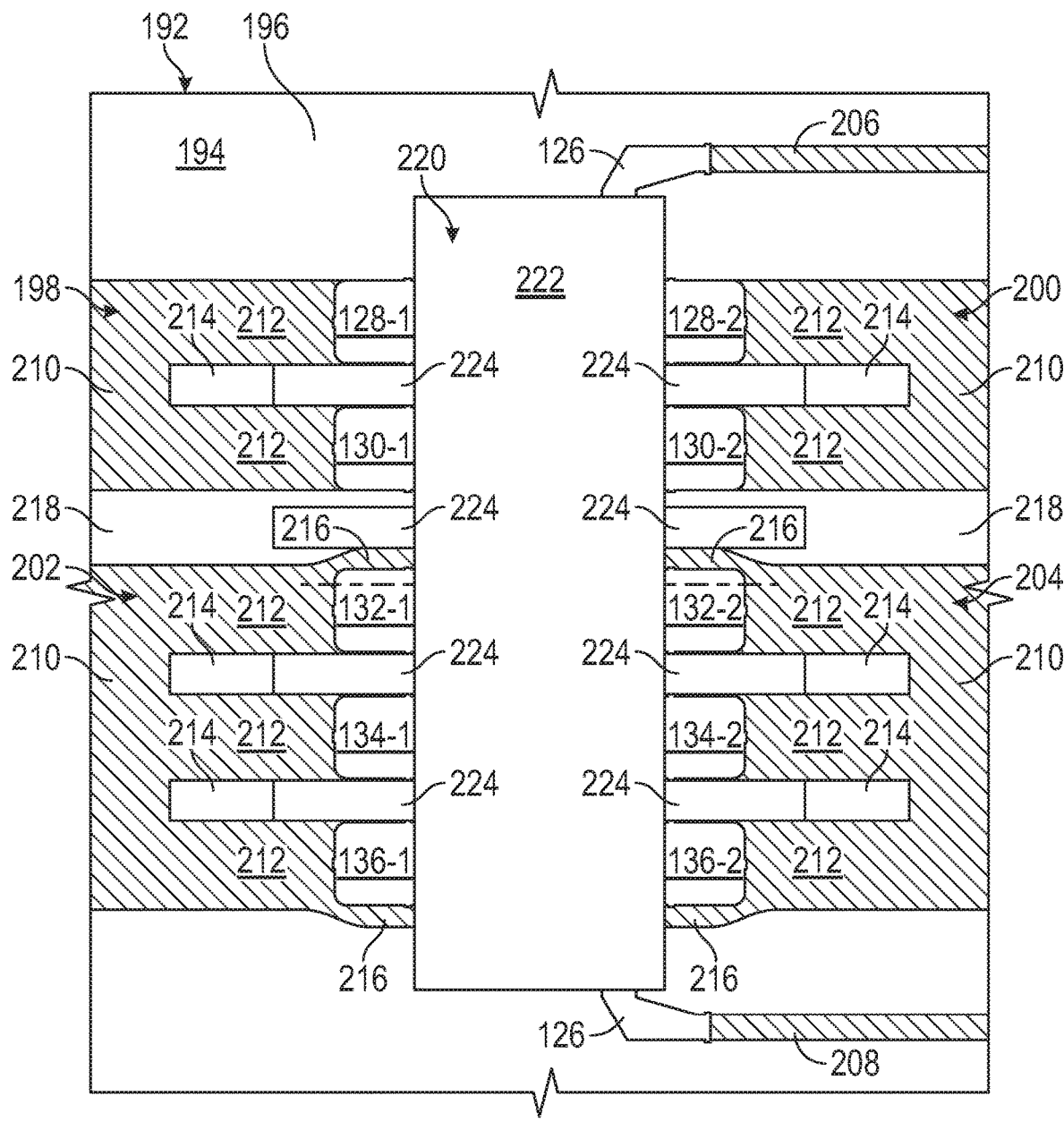
FIG. 9 is a planform view of the PA system shown in FIG. 8 after installation of a fingered isolation device over the 10-lead Doherty PA package, as illustrated in accordance with an example embodiment.
Figure 10:
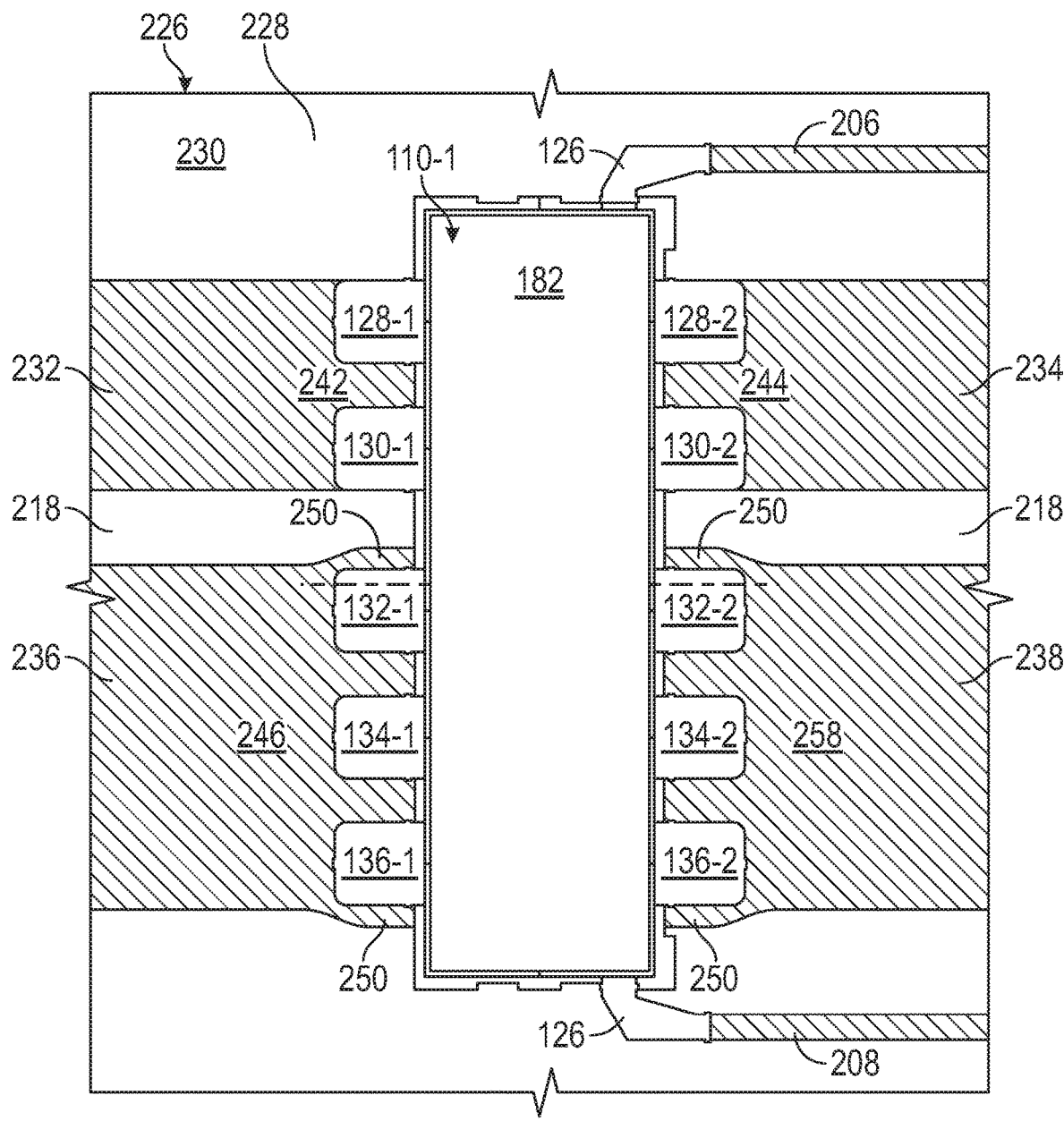
FIG. 10 is a planform view of a second example PA system including the 10-lead Doherty PA package shown in FIGS. 3-7 and including a substrate having non-branched transmission lines.

Referring briefly to FIG. 9, the Doherty PA system 192 may be fabricated further include a fingered shield device, card, or overlay structure 220 in embodiments. When present, the fingered shield structure 220 may include a shield body 222 installed over the Doherty PA package 110-1. The shield structure body 222 may extend around the periphery of the Doherty PA package 110-1 and, perhaps, may have an underside cavity or recess in which an upper portion of the Doherty PA package 110-1 is matingly received or physically registers. In other instances, the shield structure body 222 may rest on an upper surface of the Doherty PA package 110-1 and may be retained in place by, for example, soldering or adhesive attachment. The fingered shield structure 220 further includes a plurality of isolation fingers 224, which project from opposing longitudinal edges of the shield structure body 222 and which extend downwardly (toward the upper surface 194 of the substrate 196) to extend between (and thus physically separate or partition) some, if not all adjacent leads contained the Doherty PA package 110-1. Stated differently, the isolation fingers 224 may be physically interspersed with the package leads when the fingered shield structure 220 is installed over the Doherty PA package 110-1 to further reduce cross-coupling between neighboring signal paths. To provide this function, the fingered shield structure 220, particularly the isolation fingers 224, may be wholly or partially composed of an electrically-conductive material (e.g., a Cu-based alloy) and electrically grounded in embodiments. Additionally, selected portions of the isolation fingers 224 or, more generally, the fingered shield structure 220 may be composed of or covered by a magnetically-permeable material of the type described above in connection with FIG. 2.

The above-noted advantages notwithstanding, the Doherty PA package 110-1 may be utilized in conjunction with substrates containing non-branched interconnect features or transmission lines in further embodiments. Consider, in this regard, the Doherty PA system 226 shown in FIG. 10. As was previously the case, the Doherty PA system 226 includes a PCB or other substrate 228 having an upper surface or frontside 230 on which a number of interconnect features (signal transmission lines 206, 208, 232, 234, 236, 238) are formed. The Doherty PA package 110-1 is soldered or otherwise mounted to the upper surface 230 of the substrate 238 such that the carrier input leads 128-1, 130-1 contact the bond pad area 212 of the upper left transmission line 232, which has a non-branched, continuous, or block-like form factor lacing the above-described isolation notches. As a result, the bond pad area 212 concurrently contacts the carrier input leads 128-1, 130-1, while spanning the gap or spacing separating the package leads 128-1, 130-1 taken along the longitudinal axis of the Doherty PA package 110-1.

In a manner similar to the carrier input leads 128-1, 130-1 and bond pad area 212 of the upper left transmission line 232, the carrier output leads 128-2, 130-2 contact the upper right transmission line 212 (setting aside transmission line 206), which likewise has bond pad area 214 having a non-branched or unitary shape. The bond pad area 214 thus also spans the gap between the package leads 128-1, 130-1, while contacting the leads 128-1, 130-1. Lastly, the lower transmission lines 246, 248 contact the carrier input leads 132-1, 134-1, 136-1 and the carrier output leads 132-2, 134-2, 136-2, respectively. Again, the lower transmission lines 246, 248 are imparted with continuous, non-branched or non-trifurcated geometries in the present example such that continuous bond pad areas 246, 248 are provided for electrical contact with the corresponding package leads of the Doherty PA package 110-1. In addition to contacting the appropriate package leads, the bond pad areas 246, 248 also span the gaps separating the input-side lead group 132-1, 134-1, 136-1 and the output-side lead group 132-2, 134-2, 136-2. If desired, the bond pad areas 246, 248 may be imparted with flared-out or widen corner regions 250 adjacent the lead pairs 132, 136 to improve current distribution uniformity in the manner previously described.

The foregoing has thus described the example Doherty PA package 110-1 in detail, as well as Doherty PA systems in which the Doherty PA package 110-1 may be deployed. As discussed above, the Doherty PA package 110-1 is fabricated to contain redundant peaking and carrier signal amplification paths, while providing an asymmetrical allotment of die bond area in favor the peaking transistor(s) for enhanced performance characteristics. Further, the Doherty PA package 110-1 is compatible with branched transmission line (interconnect line) connection schemes and fingered isolation structures when integrated into a larger Doherty PA system, such as that described above in connection with FIGS. 8 and 9. As a still further advantage, the Doherty PA package 110-1 (and, more accurately, the design-flexible PA package platform 110 (FIG. 3) upon which the Doherty PA package 110-1 is built) affords the designer with increased opportunities to produce variations of the Doherty PA package 110-1 optimized for a particular application or usage. For example, Doherty PA packages can be produced utilizing the package platform 110 to contain differing combinations of carrier and peaking signal amplifications paths, to provide asymmetrical allotments of die bond area in favor the peaking transistor(s) or to have symmetrical die bond area allotments, to support N-way Doherty circuit layouts (N>2), and/or to provide enhanced isolation between the carrier and peaking paths extending through the PA package. Further emphasizing this point, several alternative examples of the Doherty PA packages potentially fabricated utilizing the PA package platform 110 (FIG. 3) will now be described in connection with FIGS. 11-13.

Figure 11:
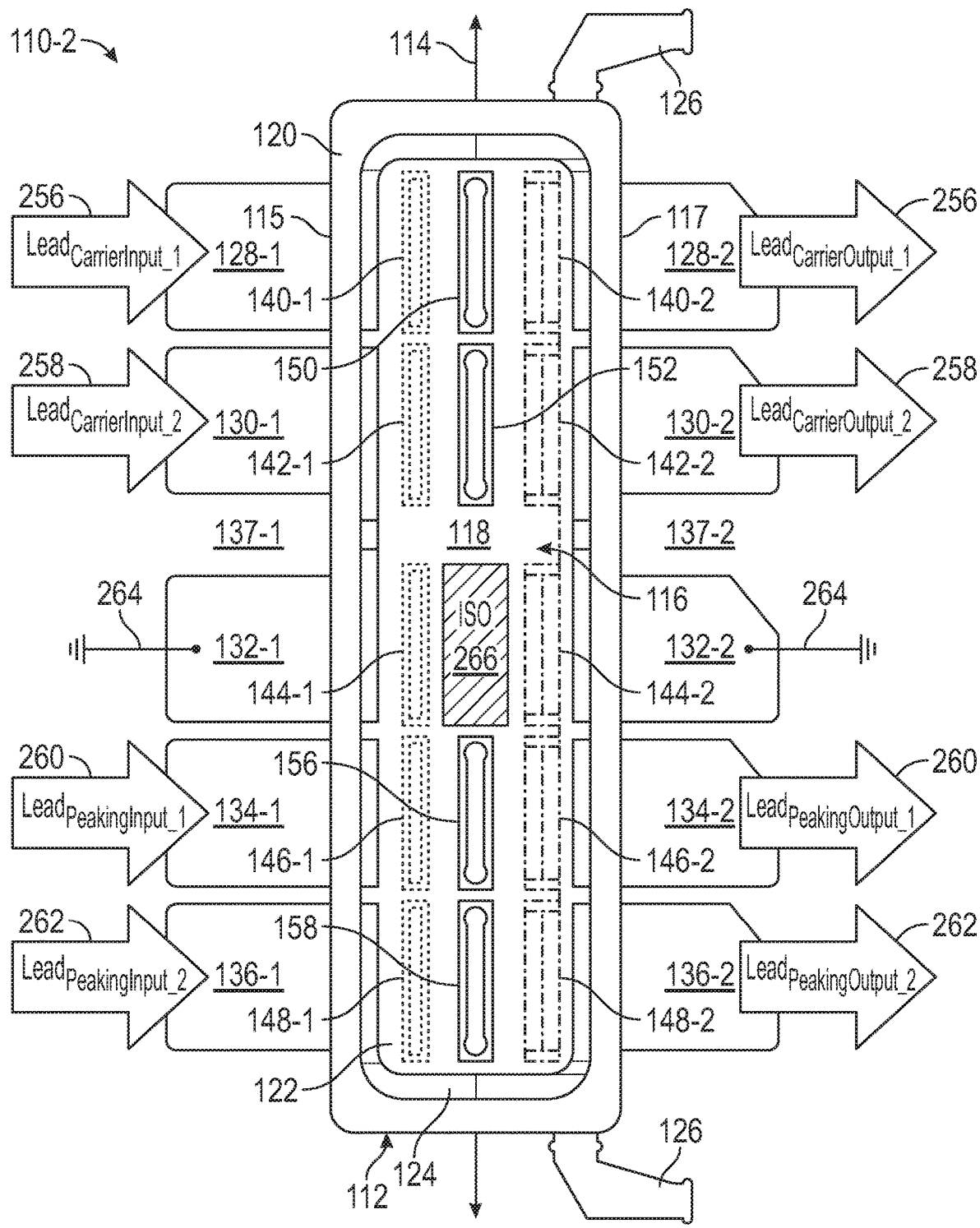
FIGS. 11-13 are planform views of 10-lead Doherty PA packages produced utilizing the design-flexible PA package platform shown in FIG. 3 and imparted with different Doherty PA configurations, as illustrated in accordance with further example embodiments of the present disclosure.

Referring to FIG. 11, a Doherty PA package 110-2 having a second configuration and suitably produced utilizing the design-flexible PA package platform 110 (FIG. 3) is presented. In this drawing figure, and in FIGS. 12-13 further discussed below, like reference numerals are carried-over from previous drawing figures, where appropriate, to denote like elements, while wirebonds are hidden from view to avoid obscuring details of the drawings. As indicated by arrows 256, 258, 260, 262, two parallel carrier signal amplification paths 256, 258; and two parallel peaking signal amplification paths 260, 262 are provided through the design-flexible PA package 110-2. Further, as indicated by symbols 264, one or both of the leads 132-1, 132-2 located between the carrier signal amplification paths 256, 258 and the peaking signal amplification paths 260, 262 serve as isolation leads, which may be electrically coupled to ground (or another reference voltage) when the Doherty PA package 110-2 is installed in a larger Doherty PA system, such as the Doherty PA system 192 shown in FIGS. 8 and 9. The Doherty PA package 110-2 may thus be described as having a symmetric, two-way, four-path Doherty configuration in the instant embodiment, with the total die bond area allotted to the carrier PA die(s) 150, 152 being substantially equivalent to the total die bond area allotted to the peaking PA die(s) 156, 158.

In certain instances, additional signal isolation or shielding may be desirably provided between the carrier signal amplification path 258 and the adjacent peaking signal amplification path 260 beyond that provided by merely grounding the intermediate isolation leads 132-1, 132-2 and/or by leaving the die bond region between the isolation leads 132-1, 132-2 unoccupied by a device. In such instances, at least one package-internal isolation structure 266 may be positioned within the package body 112 at a location between the carrier PA transistor die 152 and the peaking PA transistor die 156, as taken along the longitudinal axis 114. Further, the isolation structure 266 may laterally align with the lead pair 132 and may be electrically coupled to one or both of the isolation leads 132-1, 132-2.

In various embodiments, the package-internal isolation structure 266 may assume the form of a ground plane or an electrically-conductive wall, which is electrically coupled between the isolation leads 132-1, 132-2 and/or which is electrically coupled to ground through either or both of the isolation leads 132-1, 132-2. In other embodiments, the package-internal isolation structure 266 may contain one or more layers of a magnetically-permeable material and, perhaps, may have a construction similar to isolation features 108-1, 108-2 described above in connection with FIG. 2. The generic illustration in FIG. 11 of isolation feature 266, then, encompasses various different types of electrically-conducive and magnetically-permeable isolation structures (including structures similar or identical to those shown in FIG. 2) suitable for reducing cross-coupling between the carrier signal path corresponding to arrows 258 and the adjacent peaking signal path corresponding to arrows 260.

Figure 12:
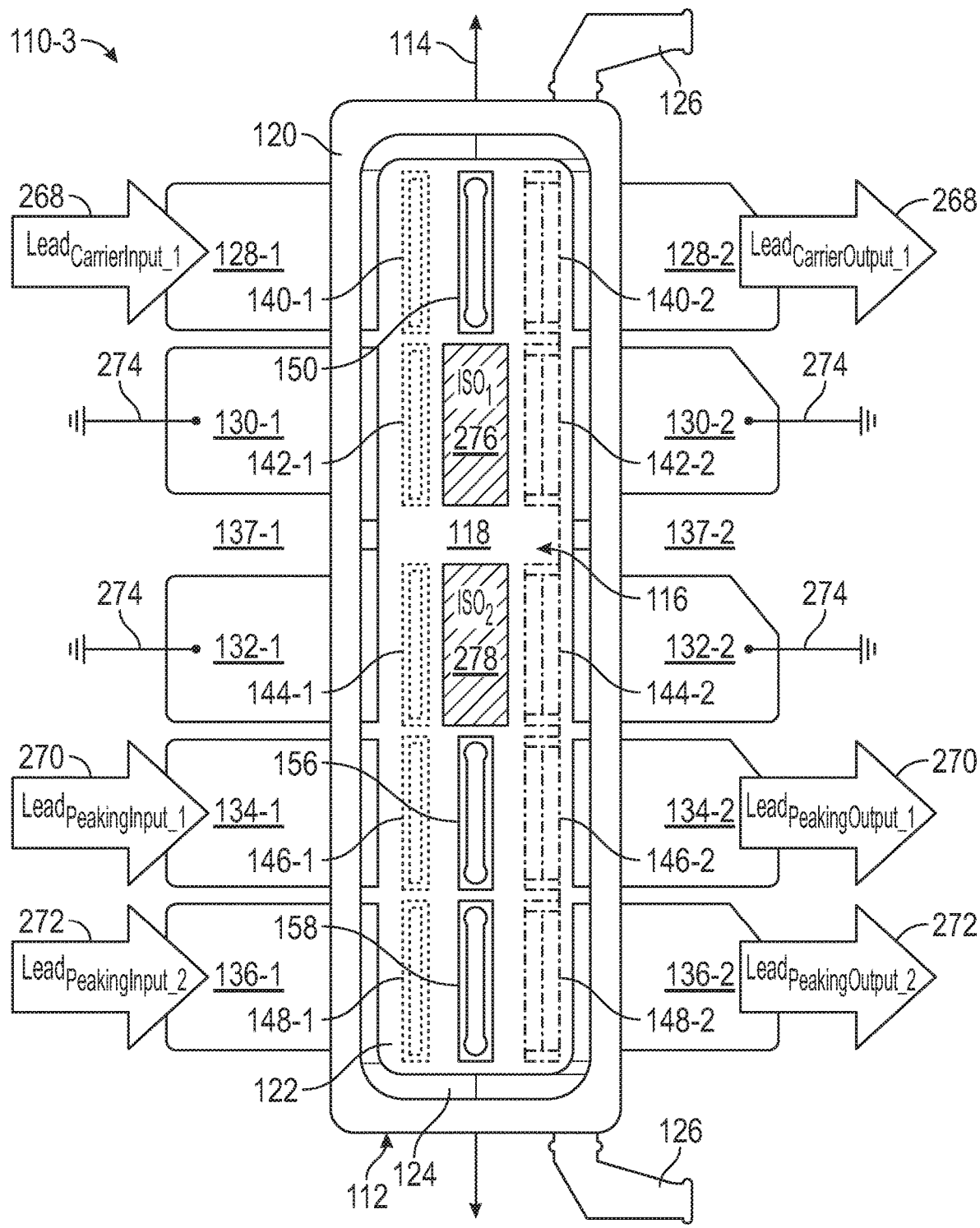

Turning to FIG. 12, a Doherty PA package 110-3 is presented further suitably produced utilizing the design-flexible PA package platform 110 and having a third Doherty circuit configuration or layout. In this example, the Doherty PA package 110-3 is imparted with an asymmetric, two-way, three-path Doherty configuration or circuit topology. The Doherty PA package 110-3 includes only a single signal carrier signal amplification path in this configuration, as represented arrows 268. The Doherty PA package 110-3 further includes two parallel peaking carrier signal amplification paths, which are denoted by arrows 270, 272. Here, the intervening leads 130-1, 130-2, 132-1, 132-2 located between the signal paths 268, 270 may serve as isolation leads, with some or all of the leads 130-1, 130-2, 132-1, 132-2 coupled to electrical ground, as indicated by symbols 274. Once again, the Doherty PA package 110-3 may include one or more isolation structures 276, 278, which may have a structure and composition as previously described. When present, the isolation structure 276 may laterally align with the leads 130-1, 130-2 and, perhaps, may be electrically coupled to ground through either or both of the leads 130-1, 130-2. Similarly, the isolation structure 238 may laterally align with the leads 132-1, 132-2 and may be electrically coupled to ground through either or both of the leads 132-1, 132-2. In other instances, one or both of the isolation structures 276, 278 may be omitted from the Doherty PA package 110-3.

Figure 13:
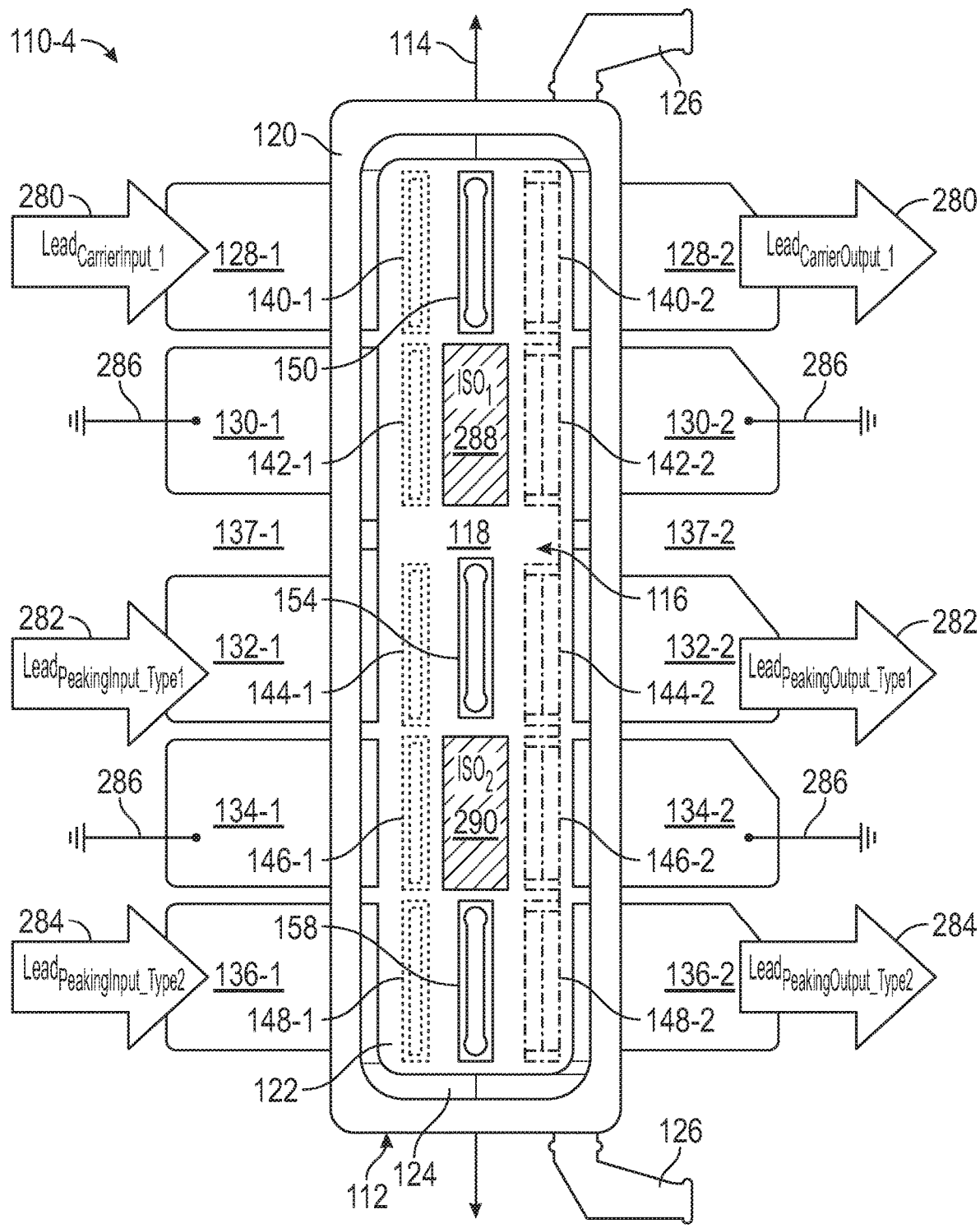

FIG. 13 illustrates a Doherty PA package 110-4 having a further example configuration; i.e., a three-way, three-path, symmetrical Doherty configuration. In this example, the Doherty PA package 110-4 includes a carrier signal amplification path (represented by arrows 280), a peaking signal amplification path of a first type or level (represented by arrows 282), and a peaking signal amplification path of a second type or level (represented by arrows 284). Again, the package leads located between the carrier signal amplification path 280 and the peaking signal amplification path 282 may be coupled to electrical ground (symbols 286) and/or electrically coupled to a first isolation feature 288 within the Doherty PA package 110-4 to provide additional isolation between the signal paths 280, 282. In this instance, and for all other isolation features described herein, the isolation feature 288 can be an electrically-conductive wall or ground plane; and/or may contain an electrically-conducive body having a wall-like form factor to which one or more magnetically-permeable layers may be bonded, as described above in connection with FIG. 2. Similarly, the leads located between the peaking signal amplification paths 282, 284 may be coupled to electrical ground (symbols 286) and/or electrically coupled to a second isolation feature 290 (e.g., a ground plane or multi-layer wall) within the Doherty PA package 110-4 to provide additional isolation between the signal paths 280, 282, as desired. Comparing briefly the Doherty PA package 110-4 to the circuit structure shown in FIG. 2, the carrier signal amplification path 280 may generally correspond to path 70-1, the isolation feature 288 may generally correspond to feature 106-1, the peaking signal amplification path 282 may generally correspond to path 70-2, the isolation feature 290 may generally correspond to feature 106-2, and the peaking signal amplification path 284 may generally correspond to path 70-3.

The Doherty PA packages 110-2, 110-3, 110-4 shown in FIGS. 11-13 thus collectively provide additional examples of Doherty circuit configurations suitably fabricated utilizing the base package platform 110 shown in FIG. 3. While the above-described design-flexible PA package platform 110 (FIG. 3) and the Doherty PA packages 110-1, 110-2, 110-3, 110-4 share a particular form factor, lead count, and general construction in the present example, it is emphasized that additional embodiments of the package platforms and PA packages can be produced to possess various other form factors, lead counts, and physical constructions, as desired. For example, in further embodiments, the Doherty PA packages can be produced in accordance with the present teachings, while including six leads divided into a three-lead input-side array and a three-lead output-side array; including eight leads divided into a four-lead input-side array and a four-lead output-side array; including twelve leads divided into a six-lead input-side array and a six-lead output-side array; and so on. Further description in this regard is provided below in connection with FIGS. 14 and 15.

Figure 14:
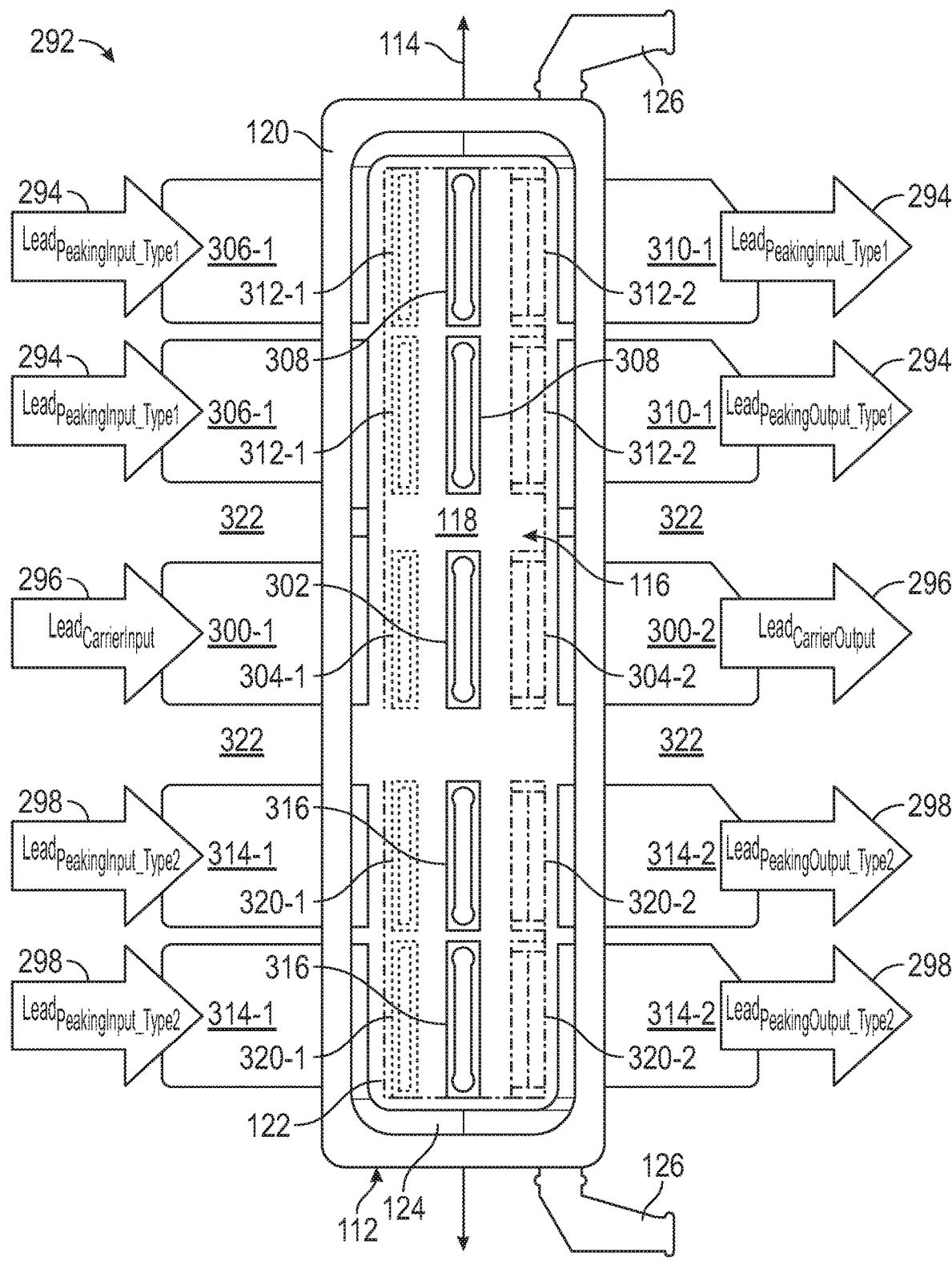
FIGS. 14 and 15 are planform views of Doherty PA packages having different form factors and lead counts, as illustrated in accordance with still further example embodiments of the present disclosure.

Addressing next FIG. 14, there is shown a 10-lead Doherty PA package 292 fabricated to in accordance a three way, asymmetric configuration. Specifically, the illustrated 10-lead Doherty package 292 includes: (i) two parallel peaking signal amplification paths (represented by arrows 294) of a first type, (ii) a single carrier signal amplification path (represented by arrows 296), and (iii) two parallel peaking signal amplification paths of a second type (represented by arrows 298). The carrier signal amplification path 296 extends from a carrier input lead 300-1, through a carrier PA die 302, and to a carrier output lead 300-2. Input- and output-side IPDs 304-1, 304-2 may also be provided in the carrier signal amplification path 296, as previously described. The parallel peaking input paths 294 may each extend from a peaking input lead 306-1, through a peaking PA die 308, and to a peaking output lead 308-1; possibly also passing through an input-side IPD 312-1 and an output-side IPD 312-2, as shown. Similarly, the parallel peaking input paths 298 each extend from a peaking input lead 314-1, through a peaking PA die 316, and to a peaking output lead 318-1; possibly also passing through an input-side IPD 320-1 and an output-side IPD 320-2, when present.

By virtue of the above-described circuit layout of the Doherty PA package 292, the carrier signal amplification path 296 are located between the parallel peaking signal amplification paths 294 and the peaking signal amplification paths 298. Additionally, enlarged isolation gaps 322 are provided between the lead pair 132 through which the signal amplification path 296 passes and the adjacent lead pairs 130, 134 on either side lead pair 132. As previously discussed, the respective widths of the isolation gaps 322 may be greater than the lead-to-lead spacing or the "intra-group (IG) lead spacing" within the closely-spaced lead groups, as taken along the longitudinal axis 114. The provision of isolation gaps 322 may therefore provide reduced cross-coupling in at least some instances. In other embodiments, the isolation gaps 300 may be omitted such that lead pairs 128, 130, 132, 134, 136 are equally spaced as taken along the longitudinal axis 114 of the Doherty PA package 292.

Figure 15:
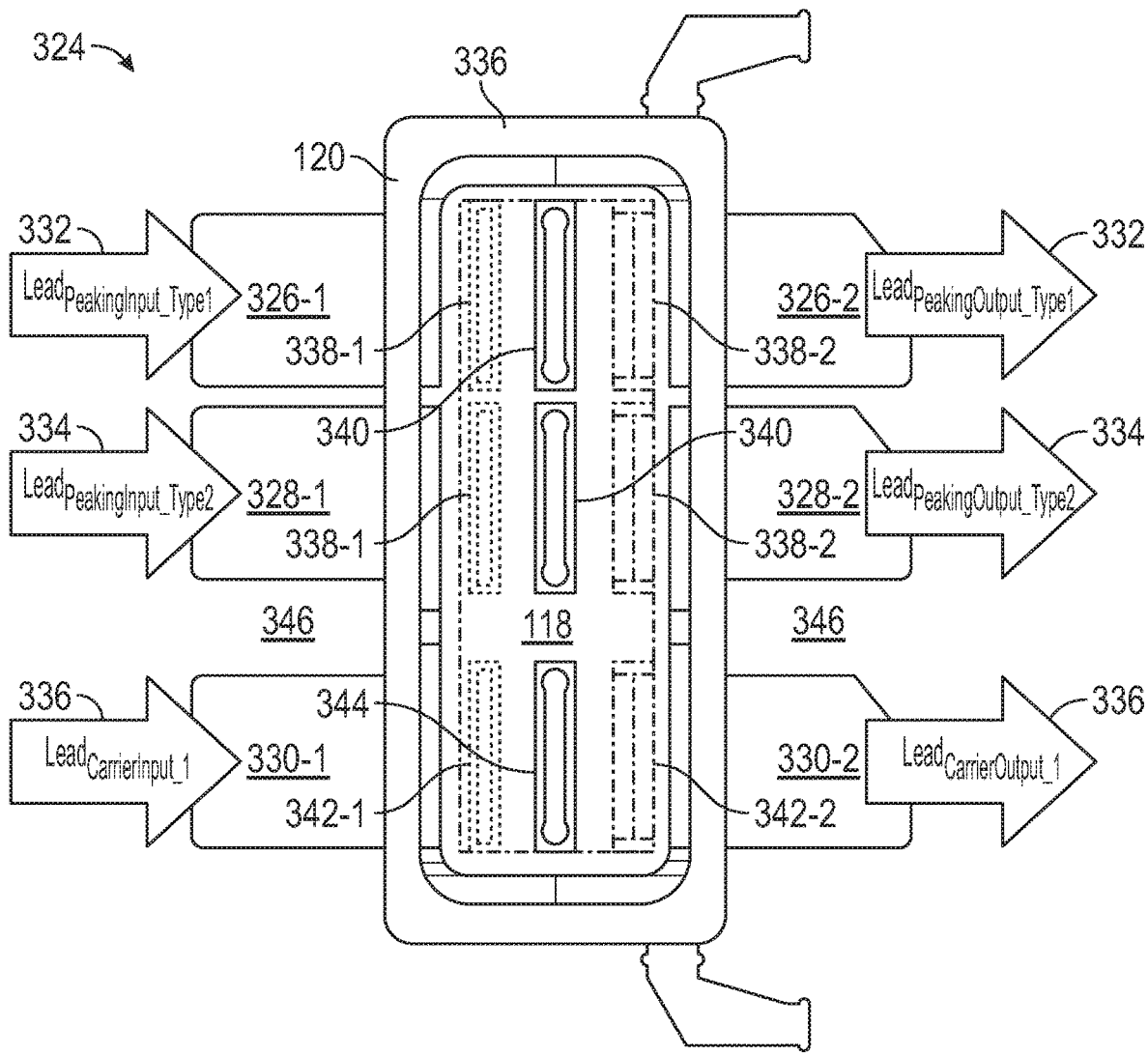

Referring lastly to FIG. 15, an example 6-lead Doherty PA package 324 is depicted. Here, the Doherty PA package 324 includes three input-side leads 326-1, 328-1, 330-1 distributed in an input-side lead array and three output-side leads 326-2, 328-2, 330-2 distributed in an output-side lead array. As indicated by arrows 332, 334, two peaking amplification signal paths extend through the body 336 of the Doherty PA package 324. Specifically, each peaking signal amplification path 332, 334 extends from the input lead 326-1 or 328-1, through an input-side IPD 338-1, through a peaking PA die 340, through an output-side IPD 338-2, and to the output lead 326-2 or 328-2. Comparatively, a single carrier signal amplification path 336 extends from the input lead 330-1, through an input-side IPD 342-1, through a carrier PA die 344, through an output-side IPD 342-2, and to the output lead 330-2.

As was previously the case, enlarged isolation gaps 346 are provided between the upper lead groups 326-1, 328-1 and 326-2, 328-2 and the carrier lead pair 330. The isolation gaps 346 are dimensioned to have widths exceeding the lead-to-lead or IG lead spacing within the lead groups 326-1, 328-1 and 326-2, 328-2, as taken along the longitudinal axis of the PA package 324. In further embodiments, the enlarged isolation gap 346 may be eliminated such that the longitudinal spacing between the corresponding lead pairs 326, 328, 330 is substantially equivalent. Other configurations are also possible for the illustrated 6-lead Doherty PA package 324. For example, in a further implementation in which the Doherty PA package 324 is imparted with a two-way, symmetric, dual-path architecture, a carrier signal amplification path may be formed through the upper lead pair 326 and a peaking signal amplification path may be formed through the lower lead pair 330, while the intermediate lead pair 328 is electrically grounded (or, at minimum, a signal amplification path is not provided through the intermediate lead pair 328). In such an embodiment, an isolation feature may be, but is not necessarily contained within the Doherty PA package 324 at a location laterally aligned with the intermediate lead pair 328 and electrically grounded through either or both of leads 328-1, 328-2.

CONCLUSION

There has thus bene provided PA (power amplifier) packages incorporating design-flexible package platforms, as well as to PA systems containing such packages. By virtue of the above-described structural features and constructions, design flexibility is enhanced allowing different PA circuit configurations to be fabricated utilizing a common PA package platform. This enables a reduction in manufacturing costs, particularly as embodiments of the PA package are well-suited for leadframe-based manufacturing, while allowing optimization of a circuit configuration for a particular application or usage. Performance benefits may also be realized by producing a particular design-flexible PA package to include additional peaking and/or carrier signal amplification paths, to provide an asymmetrical allotment of die bond area in favor the peaking transistor(s), to support N-way Doherty circuit layouts (N>2), and/or to provide enhanced isolation between signal carrying (e.g., peaking and carrier) paths, as desired. Further, in contrast to asymmetric Doherty packages having leads of varying widths, embodiments of the PA package may be produced to include asymmetric Doherty layouts disposed between uniform-width lead arrays spaced along the input and output sides of the package. The uniform-width lead arrays may include multiple lead sets for usage in forming the peaking signal amplification paths and, depending on the total number of leads in the package, for usage in forming the carrier signal amplification paths. This may provide an increased benefit in reducing internal cross-coupling by distancing the overall combined current from the power devices, particularly when the PA package is mounted to a substrate having corresponding branches transmission lines (FIG. 8) and/or when utilized with a fingered isolation device matingly installed over and around the PA package (FIG. 10).

In embodiments, the PA includes a package body having a longitudinal axis, a first group of input-side leads (e.g., leads 132-1, 134-1, 136-1 in FIGS. 3-5 and 7-10), and a first group of output-side leads (e.g., leads 132-2, 134-2, 136-2 in FIGS. 3-5 and 7-10). The first group of input-side leads projects from a first side of the package body and is separated by an IG lead spacing taken along the longitudinal axis. Comparatively, the first group of output-side leads projects from a second side of the package body, is separated by the IG lead spacing, and is laterally aligned with the first group of input-side leads. A first carrier input lead (e.g., the lead 130-1 in FIGS. 3-5 and 7-10) projects from the first side of the package body and is spaced from the first group of input-side leads by an input-gap isolation gap, the input-side isolation gap having a width exceeding the intra-group (IG) lead spacing along the longitudinal axis. Similarly, a first carrier output lead (e.g., the lead 130-2 in FIGS. 3-5 and 7-10) projects from the second side of the package body, is separated from the first group of output-side leads by an output-side isolation gap (which may also have the isolation gap width), and is laterally aligned with the first carrier input lead. In certain cases, the PA package may further include: (i) a second carrier input lead (e.g., the lead 128-1 in FIGS. 3-5 and 7-10) projecting from the first side of the package body, with the first carrier input lead located between second carrier input lead the first group of input-side leads taken along the longitudinal axis; and (ii) a second carrier output lead (e.g., lead 128-2 in FIGS. 3-5 and 7-10) projecting from the second side of the package body and laterally aligned with the second carrier input lead, the second carrier input lead located between second carrier output lead the first group of output-side leads taken along the longitudinal axis.

In other embodiments, the PA package may include a package body having a longitudinal axis, a plurality of carrier signal amplification paths through the package body, and a plurality of peaking signal amplification paths provided through the package body. The plurality of carrier signal amplification paths may include X number of carrier input leads, X number of carrier output leads, and at least one carrier PA die contained in the package body and electrically coupled between the carrier input leads and the carrier output leads. Comparatively, the plurality of peaking signal amplification paths may include Y number of peaking input leads, Y number of peaking output leads, and at least one peaking PA die contained in the package body and electrically coupled between the peaking input leads and the peaking output leads. In certain embodiments, the PA package may include two or more carrier signal amplification paths and an equal or greater number of peaking signal amplification paths such that $1 < X \leq Y$. In other embodiments, the PA package may include more peaking signal amplification paths than carrier signal amplification paths such that $X < Y$.

In a further embodiment, a PA system includes a PA package and a substrate. The PA package includes, in turn: (i) a package body having a longitudinal axis; (ii) a first group of input-side leads projecting from a first side of the package body and separated by an IG lead spacing taken along the longitudinal axis; (iii) a first group of output-side leads projecting from a second side of the package body, separated by the IG lead spacing, and laterally aligned with the first group of input-side leads; (iv) a first carrier input lead projecting from the first side of the package body and spaced from the first group of input-side leads by an isolation gap taken along the longitudinal axis, the isolation gap having a width exceeding the IG lead spacing; and (v) a first carrier output lead projecting from the second side of the package body, separated from the first group of output-side leads by the isolation gap, and laterally aligned with the first carrier input lead. The substrate includes an upper surface to which the PA package is mounted, as well as interconnect lines (e.g., printed traces) formed on the upper surface of the substrate and electrically coupled to the PA package. In certain embodiments, the interconnect lines may include a first branched interconnect line having a plurality of transmission line branches, with each lead in the group of input-side leads contacting a different one of the plurality of transmission line branches. In such embodiments, the group of input-side leads may include first, second, and third peaking input leads; and while the plurality of transmission line branches include a first transmission line branch contacting the first peaking input lead and having a first average width; a second transmission line branch contacting the second peaking input lead and having a second average width less than the first average width; and a third transmission line branch contacting the first peaking input lead and having a third average width greater than the second average width; wherein the second transmission line branch is located between the first and second transmission line branches taken along the longitudinal axis.

While at least one example embodiment has been presented in the foregoing Detailed Description, it should be appreciated that a vast number of variations exist. It should also be appreciated that the example embodiment or example embodiments are only examples, and are not intended to limit the scope, applicability, or configuration of the invention in any way. Rather, the foregoing Detailed Description will provide those skilled in the art with a convenient road map for implementing an example embodiment of the invention. It being understood that various changes may be made in the function and arrangement of elements described in an example embodiment without departing from the scope of the invention as set forth in the appended claims. Numerical identifiers, such as "first," "second," "third," and the like have been used above in accordance with the order in which certain elements (e.g., package leads, lead groups, transistors, and transistor-carrying die) were introduced during the course of the foregoing Detailed Description. Such numerical identifiers may also be used in the subsequent Claims to indicate order of introduction in the Claims. Accordingly, such numerical identifiers may vary between the Detailed Description and the subsequent Claims to reflect differences in the order of introduction of elements.

What is claimed is:
1. A power amplifier (PA) package, comprising:
a package body having a longitudinal axis;
a first group of multiple adjacent input-side leads projecting from a first side of the package body and separated by an intra-group lead spacing taken along the longitudinal axis;

a first group of multiple adjacent output-side leads projecting from a second side of the package body, separated by the intra-group lead spacing, and laterally aligned with the first group of multiple adjacent input-side leads;

a first carrier input lead projecting from the first side of the package body and spaced from the first group of multiple adjacent input-side leads by an input-side isolation gap having an isolation gap width exceeding the intra-group lead spacing taken along the longitudinal axis, wherein no other leads are present in the input-side isolation gap between the first carrier input lead and the first group of multiple adjacent input-side leads; and a first carrier output lead projecting from the second side of the package body, laterally aligned with the first carrier input lead, and spaced from the first group of multiple adjacent output-side leads by an output-side isolation gap having the isolation gap width.

2. The PA package of claim 1, wherein the first group of multiple adjacent input-side leads comprises a plurality of peaking input leads projecting from the first side of the package body and separated by the intra-group lead spacing; and wherein the first group of multiple adjacent output-side leads comprises a plurality of peaking output leads projecting from the second side of the package body, separated by the intra-group lead spacing, and laterally aligned with the plurality of peaking input leads.

3. The PA package of claim 2, further comprising:

a second carrier input lead projecting from the first side of the package body, the first carrier input lead located between the second carrier input lead and the first group of multiple adjacent input-side leads taken along the longitudinal axis; and a second carrier output lead projecting from the second side of the package body and laterally aligned with the second carrier input lead, the second carrier input lead located between the second carrier output lead and the first group of multiple adjacent output-side leads taken along the longitudinal axis.

4. The PA package of claim 1, further comprising:

a second group of input-side leads projecting from the first side of the package body, separated by the intra-group lead spacing, and including the first carrier input lead; and a second group of output-side leads projecting from the second side of the package body, separated by the intra-group lead spacing, laterally aligned with the second group of input-side leads, and including the first carrier output lead.

5. The PA package of claim 4, wherein the first group of multiple adjacent input-side leads consists of Y number of peaking input leads;

wherein the first group of multiple adjacent output-side leads consists of Y number of peaking output leads;

wherein the second group of input-side leads consists of X number of carrier input leads;

wherein the second group of output-side leads consists of X number of carrier output leads; and wherein Y is greater than X.

6. The PA package of claim 1, wherein each lead in the first group of multiple adjacent input-side leads, each lead in the first group of multiple adjacent output-side leads, the first carrier input lead, and the first carrier output lead have equivalent maximum lead widths taken along the longitudinal axis.

7. The PA package of claim 1, wherein the first group of multiple adjacent input-side leads comprises a first peaking input lead projecting from the first side of the package body;

wherein the first group of multiple adjacent output-side leads comprises a first peaking output lead projecting from the second side of the package body and laterally aligned with the first peaking input lead;

wherein the PA package further comprises:

a peaking PA die contained in the package body and electrically coupled between the first peaking input lead and the first peaking output lead; and a carrier PA die contained in the package body and electrically coupled between the first carrier input lead and the first carrier output lead.

8. The PA package of claim 7:

wherein the first group of multiple adjacent input-side leads comprises an input-side isolation lead projecting from the first side of the package body;

wherein the first group of multiple adjacent output-side leads comprises an output-side isolation lead projecting from the second side of the package body and laterally-aligned with the input-side isolation lead; and wherein the PA package further comprises an isolation structure within the package body, positioned between the peaking PA die and the carrier PA die taken along the longitudinal axis, and electrically coupled to at least one of the input-side isolation lead and the output-side isolation lead.

9. The PA package of claim 1, wherein the isolation gap width is at least 50% greater than the intra-group lead spacing.

10. A power amplifier (PA) package, comprising:

a package body having a longitudinal axis;

a plurality of carrier signal amplification paths extending through the package body, the plurality of carrier signal amplification paths comprising:

X number of carrier input leads;

X number of carrier output leads; and at least one carrier PA die contained in the package body and electrically coupled between the carrier input leads and the carrier output leads; and a plurality of peaking signal amplification paths extending through the package body, the plurality of peaking signal amplification paths comprising:

Y number of peaking input leads;

Y number of peaking output leads; and at least one peaking PA die contained in the package body and electrically coupled between the peaking input leads and the peaking output leads; and wherein 1<X<Y.

11. The PA package of claim 10, wherein carrier input leads, the carrier output leads, the peaking input leads, and the carrier output leads have equivalent maximum lead widths taken along the longitudinal axis.

12. The PA package of claim 10, wherein the carrier input leads are distributed in a first input-side lead group having a first intra-group spacing, the peaking input leads are distributed in a second input-side lead group having a second intra-group spacing, the carrier output leads are distributed in a first output-side lead group having the first intra-group spacing, and the peaking output leads are distributed in a second output-side lead group having the second intra-group spacing.

13. The PA package of claim 12, further comprising:

an input-side isolation gap separating the first and second input-side lead groups taken along the longitudinal axis; and an output-side isolation gap separating the first and second output-side lead groups taken along the longitudinal axis.

14. The PA package of claim 13, wherein the input-side isolation gap and the output-side isolation gap each have a width exceeding the first intra-group spacing and exceeding the second intra-group spacing.

15. A power amplifier (PA) system, comprising:
a PA package, comprising:
a package body having a longitudinal axis;
a first group of multiple adjacent input-side leads projecting from a first side of the package body and separated by an intra-group lead spacing taken along the longitudinal axis;
a first group of multiple adjacent output-side leads projecting from a second side of the package body, separated by the intra-group lead spacing, and laterally aligned with the first group of multiple adjacent input-side leads;
a first carrier input lead projecting from the first side of the package body and spaced from the first group of multiple adjacent input-side leads by an input-side isolation gap having an isolation gap width exceeding the intra-group lead spacing taken along the longitudinal axis, wherein no other leads are present in the input-side isolation gap between the first carrier input lead and the first group of multiple adjacent input-side leads; and
a first carrier output lead projecting from the second side of the package body, laterally aligned with the first carrier input lead, and spaced from the first group of multiple adjacent output-side leads by an output-side isolation gap having the isolation gap width;
a substrate, comprising:
an upper surface to which the PA package is mounted; and
transmission lines formed on the upper surface of the substrate and electrically coupled to the first group of multiple adjacent input-side leads, the first group of multiple adjacent output-side leads, the first carrier input lead, and the first carrier output lead.

16. The PA system of claim 15, wherein the transmission lines comprise a first branched transmission line having a plurality of transmission line branches, each lead in the group of multiple adjacent input-side leads contacting a different one of the plurality of transmission line branches.

17. The PA system of claim 16, wherein the plurality of transmission line branches comprises:
a first transmission line branch contacting a first input-side lead contained in the first group of multiple adjacent input-side leads;
a second transmission line branch contacting a second input-side lead contained in the first group of multiple adjacent input-side leads;
a third transmission line branch contacting a third input-side lead contained in the first group of multiple adjacent input-side leads;
wherein the second transmission line branch is located between the first and third transmission line branches taken along the longitudinal axis; and
wherein the second transmission line branch has an average width exceeding an average width of the first transmission line branch and exceeding an average width of the third transmission line branch.

18. A power amplifier (PA) package, comprising:
a package body having a longitudinal axis;
a first group of three adjacent input-side leads projecting from a first side of the package body and separated by an intra-group lead spacing taken along the longitudinal axis;
a first group of three adjacent output-side leads projecting from a second side of the package body, separated by the intra-group lead spacing, and laterally aligned with the first group of input-side leads;
a second group of two adjacent input-side leads projecting from the first side of the package body and spaced from the first group of input-side leads by an input-side isolation gap having an isolation gap width exceeding the intra-group lead spacing taken along the longitudinal axis; and
a second group of two adjacent output-side leads projecting from the second side of the package body, laterally aligned with the second group of input-side leads, and spaced from the first group of output-side leads by an output-side isolation gap having the isolation gap width.

19. The PA package of claim 18, wherein the isolation gap width is at least 50% greater than the intra-group lead spacing.

20. The PA package of claim 18, wherein each lead of the first group of input-side leads, the first group of output-side leads, the second group of input-side leads, and the second group output-side leads has an equivalent maximum lead width taken along the longitudinal axis.

21. The PA package of claim 18, wherein:
the first group of three adjacent input-side leads includes a first peaking input lead,
the first group of three adjacent output-side leads includes a first peaking output lead that is laterally aligned with the first peaking input lead,
the second group of two adjacent input-side leads includes a first carrier input lead, and
the second group of two adjacent output-side leads includes a first carrier output lead that is laterally aligned with the first carrier input lead;
and wherein the PA package further comprises
a peaking PA die contained in the package body and electrically coupled between the first peaking input lead and the first peaking output lead; and
a carrier PA die contained in the package body and electrically coupled between the first carrier input lead and the first carrier output lead.

22. The PA package of claim 21, wherein:
the first group of three adjacent input-side leads includes an input-side isolation lead, and
the first group of three adjacent output-side leads includes an output-side isolation lead that is laterally aligned with the input-side isolation lead
and wherein the PA package further comprises
an isolation structure contained in the package body and electrically coupled between the input-side isolation lead and the output-side isolation lead.

23. The PA package of claim 21, wherein:
the second group of two adjacent input-side leads includes an input-side isolation lead, and
the second group of two adjacent output-side leads includes an output-side isolation lead that is laterally aligned with the input-side isolation lead
and wherein the PA package further comprises
an isolation structure contained in the package body and electrically coupled between the input-side isolation lead and the output-side isolation lead.

* * * * *